(12) United States Patent
Yasusaka et al.

(10) Patent No.: US 11,495,960 B2
(45) Date of Patent: Nov. 8, 2022

(54) SEMICONDUCTOR DEVICE

(71) Applicant: Rohm Co., Ltd., Kyoto (JP)

(72) Inventors: Makoto Yasusaka, Kyoto (JP); Isamu Iwahashi, Kyoto (JP); Kotaro Iwata, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 436 days.

(21) Appl. No.: 16/804,371

(22) Filed: Feb. 28, 2020

(65) Prior Publication Data

US 2020/0287376 A1 Sep. 10, 2020

(30) Foreign Application Priority Data

Mar. 7, 2019 (JP) .............................. JP2019-041792
Mar. 7, 2019 (JP) .............................. JP2019-041796
Mar. 7, 2019 (JP) .............................. JP2019-041798

(51) Int. Cl.
*H02H 7/20* (2006.01)
*H01L 27/02* (2006.01)
*H02H 9/02* (2006.01)

(52) U.S. Cl.
CPC ......... *H02H 7/205* (2013.01); *H01L 27/0259* (2013.01); *H01L 27/0266* (2013.01); *H01L 27/0296* (2013.01); *H01L 27/0255* (2013.01); *H02H 9/02* (2013.01)

(58) Field of Classification Search
CPC ............. H01L 27/0266; H01L 27/0296; H01L 27/0259; H01L 27/0255; H02H 7/205; H02H 9/02
USPC .......................................................... 361/88
See application file for complete search history.

(56) References Cited

U.S. PATENT DOCUMENTS

| 2009/0085649 | A1* | 4/2009 | Kondo ..................... G05F 1/56 327/538 |
| 2013/0093474 | A1* | 4/2013 | Yang .................... H03K 17/302 327/109 |
| 2017/0256938 | A1* | 9/2017 | Fukuhara ........... H03K 17/0822 |
| 2017/0346274 | A1* | 11/2017 | Nakahara ........... H03K 17/0822 |

FOREIGN PATENT DOCUMENTS

JP 2015-29251 2/2015

* cited by examiner

*Primary Examiner* — Kevin J Comber
(74) *Attorney, Agent, or Firm* — Fish & Richardson P.C.

(57) ABSTRACT

A semiconductor device includes, for example, an external terminal, an output element, a detecting element configured to detect occurrence of a negative voltage at the external terminal, and an off-circuit configured to forcibly turn off the output element when the detecting element detects occurrence of the negative voltage.

26 Claims, 22 Drawing Sheets

FIG. 13
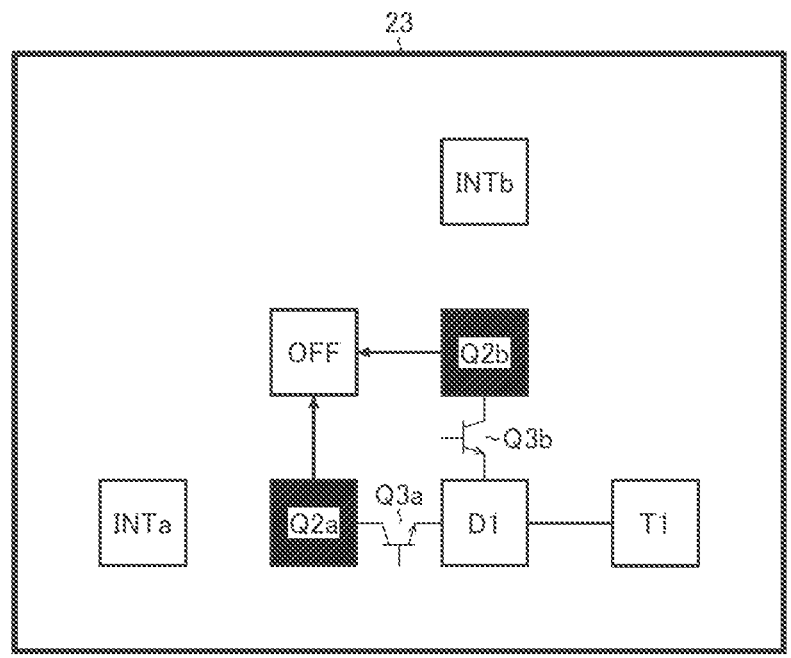
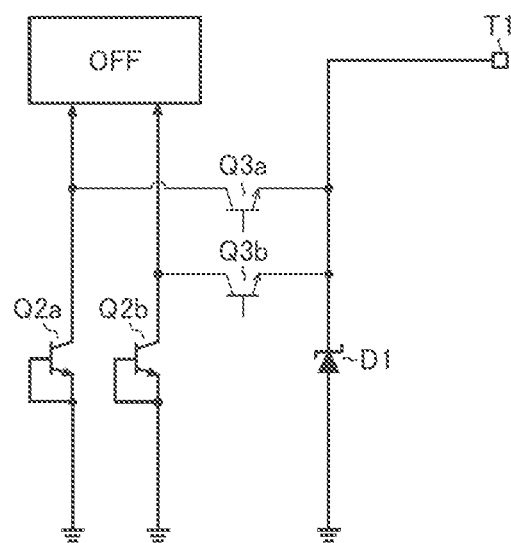

SEMICONDUCTOR DEVICE

This application is based on the following Japanese patent applications, the contents of which are hereby incorporated by reference:

(1) Japanese Patent Application filed as 2019-041792 on Mar. 7, 2019
(2) Japanese Patent Application filed as 2019-041796 on Mar. 7, 2019
(3) Japanese Patent Application filed as 2019-041798 on Mar. 7, 2019

BACKGROUND OF THE INVENTION

1. Field of the Invention

The invention disclosed herein relates to semiconductor devices.

2. Description of Related Art

Conventionally, during the operation of a semiconductor device, it is often experienced that a current applied from outside the device, or an inductance component in a coil, a conductor, or the like, causes a negative voltage to occur at an external terminal of the semiconductor device.

One example of conventional technology related to what has just mentioned is found in Japanese Unexamined Patent Application published as No. 2015-29251.

A negative voltage occurring at an external terminal of a semiconductor device may cause a parasitic element within the device to operate. Such a parasitic element is an element that is not supposed to be involved in the intended circuit operation. Thus, its operation may cause unexpected malfunctioning different from the intended circuit operation and may hence lead to malfunctioning and destruction of a set that incorporates a semiconductor device.

Generally, it is difficult to predict where within a device a parasitic element is likely to form and, even with careful chip layouts and circuit designs, it is far from easy to prevent the very formation of a parasitic element.

SUMMARY OF THE INVENTION

In view of the above-mentioned inconveniences encountered by the present inventors, an object of the invention disclosed herein is to provide a semiconductor device that can prevent malfunctioning due to a parasitic element.

For example, according to one aspect of what is disclosed herein, a semiconductor device includes: an external terminal; an output element; a detecting element configured to detect occurrence of a negative voltage at the external terminal; and an off-circuit configured to forcibly turn off the output element when the detecting element detects occurrence of the negative voltage.

For another example, according to another aspect of what is disclosed herein, a semiconductor device includes: an external terminal; an output element; a first semiconductor region connected to the external terminal; a second semiconductor region forming an internal circuit; a third semiconductor region formed closer to the first semiconductor region than the second semiconductor region is; and an off-circuit configured to forcibly turn off the output element when a parasitic element formed between the first and third semiconductor regions turns on.

For another example, according to yet another aspect of what is disclosed herein, a semiconductor device includes: an external terminal; an output element; a parasitic factor element; a first element which, along with the parasitic factor element, forms a parasitic element that operates so as to turn on the output element when a negative voltage occurs at the external terminal; and a second element which, along with the parasitic factor element, forms a parasitic element that operates so as to turn off the output element when a negative voltage occurs at the external terminal. Preferably, the second element includes at least one second element formed closer to the parasitic factor element than the first element is.

For another example, according to still another aspect of what is disclosed herein, a semiconductor device includes: an external terminal; a parasitic factor element, a first element which, along with the parasitic factor element, forms a parasitic element that operates so as to impair functional safety when a negative voltage occurs at the external terminal; and a second element which, along with the parasitic factor element, forms a parasitic element that operates so as to contribute to functional safety when a negative voltage occurs at the external terminal. Preferably, the second element includes at least one second element formed closer to the parasitic factor element than the first element is.

These and other features, elements, steps, benefits, and characteristics will become clear through the following detailed description of the best mode of the present invention in conjunction with the accompanying drawings.

BRIEF DESCRIPTION OF THE DRAWINGS

FIG. 13 is a diagram showing a semiconductor device according to a sixth embodiment;

DETAILED DESCRIPTION OF PREFERRED EMBODIMENTS

Semiconductor Device, Comparative Example

First, before a description of novel embodiments of semiconductor devices, for comparison with them, a comparative example will be described briefly.

Figure 1:
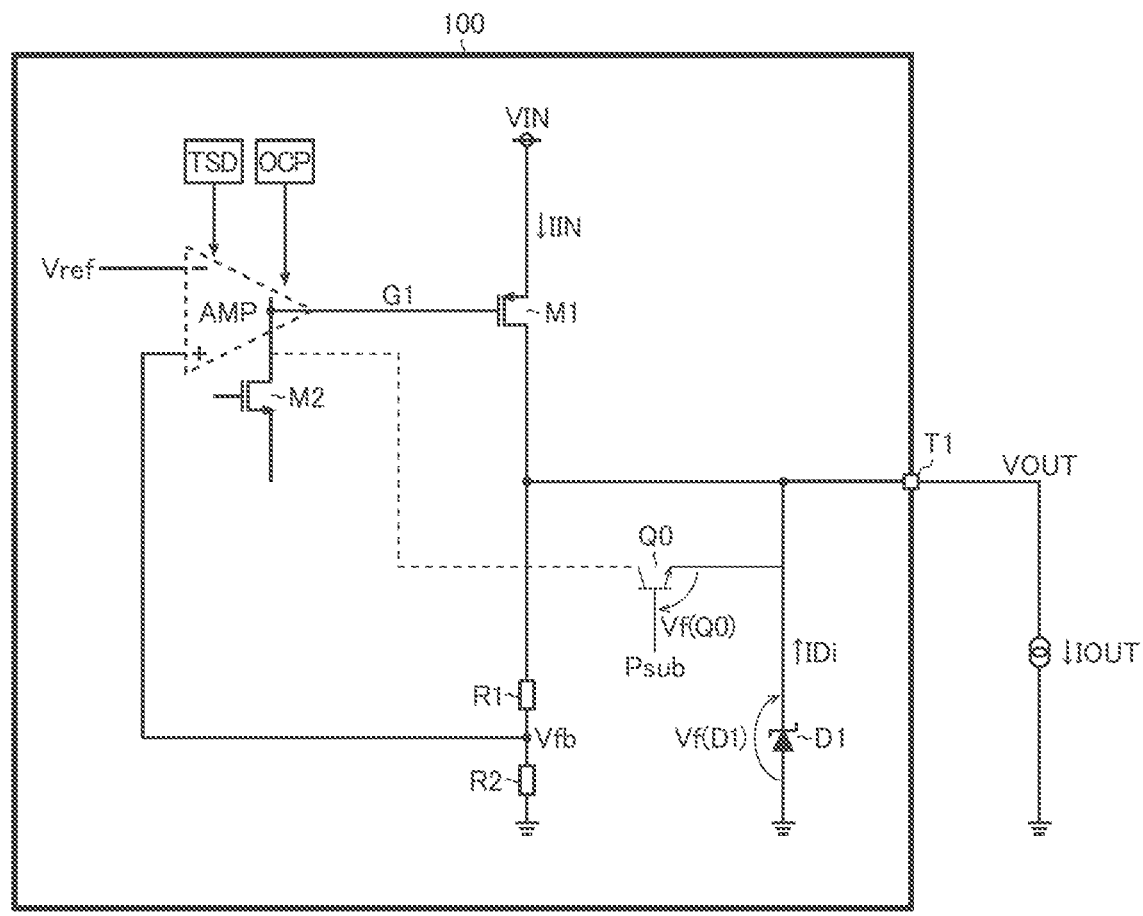
FIG. 1 is a diagram showing a semiconductor device according to a comparative example.

FIG. 1 is a diagram showing a semiconductor device according to the comparative example. The semiconductor device 100 of the comparative example is an LDO (low drop-out) regulator IC that generates an output voltage VOUT from an input voltage VIN. The semiconductor device 100 includes a P-channel MOS (metal-oxide-semiconductor) field-effect transistor M1, resistors R1 and R2, an operational amplifier AMP, a Zener diode D1, an overcurrent protection circuit OCP, an overheat protection circuit TSD, and an external terminal T1 (i.e., an output terminal). Needless to say, the semiconductor device 100 can include any other circuit element.

The source of the transistor M1 is connected to an input terminal for the input voltage VIN. The drain of the transistor M1 is connected to the external terminal T1 (i.e., an output terminal for the output voltage VOUT and hence for an output current IOUT). The gate of the transistor M1 is connected to the output terminal of the operational amplifier AMP (i.e., an application terminal for a gate signal G0. Thus, the transistor M1 is connected between the input terminal for the input voltage VIN and the output terminal for the output voltage VOUT, and functions as an output element of which the on-state resistance (and hence the conductance) is controlled continuously in accordance with the gate signal G1 applied from the operational amplifier AMP.

The resistors R1 and R2 are connected in series between the output terminal for the output voltage VOUT (i.e., the external terminal T1) and a grounded terminal (i.e., a reference potential terminal). The resistors R1 and R2 function as a resistor voltage division circuit that divides the output voltage VOUT to output the result as a feedback voltage Vfb (=VOUT×[R2/(R1+R2)]) from the connection node between those resistors. In a case where the output voltage VOUT itself is fed as the feedback voltage Vfb to the operational amplifier AMP, the resistors R1 and R2 can be omitted.

The operational amplifier AMP functions as an output driver that controls the gate signal G1 to the transistor M1 continuously such that the feedback voltage Vfb, which is fed to the non-inverting input terminal (+) of the operational amplifier AMP, and a reference voltage Vref, which is fed to the inverting input terminal (−) of the operational amplifier AMP, remain equal (such that the two voltages are imaginarily short-circuited together).

For example, when Vfb<Vref, reducing the gate signal G1 and thereby reducing the on-state resistance of the transistor M1 (i.e., increasing the conductance of the transistor M1) results in the output voltage VOUT (and hence the feedback voltage Vfb) increasing. Reversely, when Vfb>Vref, increasing the gate signal G1 and thereby increasing the on-state resistance of the transistor M1 (i.e., reducing the conductance of the transistor M1) results in the output voltage VOUT (and hence the feedback voltage Vfb) decreasing.

In this way, through output feedback control using the operational amplifier AMP, the output voltage VOUT can be held at its target value (=Vref×[(R1+R2)/R2]).

The cathode of the Zener diode D1 is connected to the output terminal for the output voltage VOUT (i.e., the external terminal T1). The anode of the Zener diode D1 is connected to the grounded terminal. The Zener diode D1 functions as an electrostatic protection element that protects the external terminal T1 from electrostatic discharge (EDS). Accordingly, it is preferable that the Zener diode D1 be provided near the external terminal T1.

The overcurrent protection circuit OCP controls the operational amplifier AMP such that, when an input current IIN that passes through the transistor M1 is higher than an overcurrent protection value IOCP, the overcurrent protection circuit OCP forcibly increases the gate signal G1 to turn off the transistor M1. Accordingly, so long as the overcurrent protection circuit OCP is operating properly, the input current TIN can be limited to not higher than the overcurrent protection value IOCP.

The overheat protection circuit TSD controls the operational amplifier AMP such that, when the junction temperature Tj of the semiconductor device 100 is higher than an overheat protection value Ttsd, the overheat protection circuit TSD forcibly increases the gate signal G1 to turn off the transistor M1. Accordingly, so long as the overheat protection circuit TSD is operating properly, the junction temperature Tj of the semiconductor device 100 can be limited to not higher than the overheat protection value Ttsd.

For reasons associated with its device structure, the semiconductor device 100 is inevitably accompanied by a parasitic element (e.g., an npn-type bipolar transistor Q0, referred to as the parasitic transistor Q0 in the following description) that is not supposed to be involved in the intended circuit operation.

In terms of what is shown in FIG. 1, the parasitic transistor Q0 is formed as a result of a P-type semiconductor substrate (Psub) acting as a base, an N-type semiconductor region of the Zener diode D1 (i.e., its cathode) acting as an emitter, and an N-type semiconductor region of an internal circuit (e.g., the drain of an N-channel MOS field-effect transistor connected as the output stage of the operational amplifier AMP to the gate of the transistor M1) acting as a collector. The parasitic transistor Q0 will now be described further with reference to a schematic vertical sectional view of the semiconductor device 100.

Figure 2:
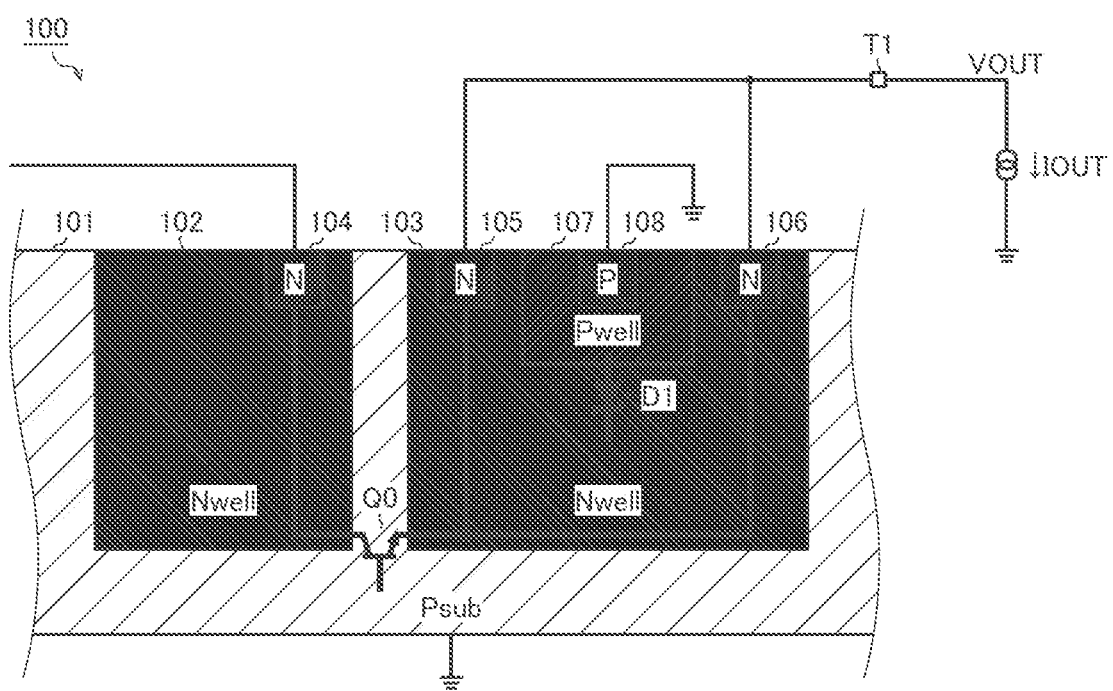
FIG. 2 is a diagram showing a vertical section of a semiconductor device.

FIG. 2 is a diagram showing a vertical section of the semiconductor device 100. In the P-type semiconductor substrate 101 of the semiconductor device 100, N-type semiconductor wells 102 and 103 are formed. In the N-type semiconductor well 102, an N-type semiconductor contact 104 is formed. In the N-type semiconductor well 103, N-type semiconductor contacts 105 and 106 are formed. In the N-type semiconductor well 103, a P-type semiconductor well 107 is formed. In the P-type semiconductor well 107, a P-type semiconductor contact 108 is formed.

The N-type semiconductor well 102 is an N-type semiconductor region for forming an internal circuit (such as an NMOS, PMOS, npn, or pnp structure), one example being the drain of a transistor M2 in FIG. 1. The N-type semiconductor well 102 is connected via the N-type semiconductor contact 104 to another internal circuit (e.g., the gate of the transistor M1 in FIG. 1).

The N-type semiconductor well 103 is an N-type semiconductor region for forming an electrostatic protection element, one example being the cathode of the Zener diode D1 in FIG. 1. The N-type semiconductor well 103 is connected via the N-type semiconductor contacts 105 and 106 to the external terminal T1.

The P-type semiconductor well 107 is a P-type semiconductor region for forming an electrostatic protection element, one example being the anode of the Zener diode D1 in FIG. 1. The P-type semiconductor well 107 is connected via the P-type semiconductor contact 108 to the grounded terminal.

In the semiconductor device 100 having the device structure described above, the parasitic transistor Q0 is formed as an npn-type bipolar transistor that results from the P-type semiconductor substrate 101 acting as a base, the N-type semiconductor well 103 or the N-type semiconductor contacts 105 and 106 (i.e., the cathode of the Zener diode D1) acting as an emitter, and the N-type semiconductor well 102 or the N-type semiconductor contact 104 (i.e., the drain of the transistor M2) acting as a collector.

In the semiconductor device 100 accompanied by the parasitic transistor Q0 described above, for example, if an output current IOUT higher than the overcurrent protection value IOCP is drawn out via the external terminal T1, a forward diode current IDi (=IOUT−IOCP) passes from the grounded terminal via the Zener diode D1 to the external terminal T1. Consequently, at the external terminal T1 occurs a negative voltage (=−Vf(D1)) that corresponds to the forward drop voltage Vf(D1) across the Zener diode D1.

If, as a result of the occurrence of the above negative voltage, a potential difference equal to or larger than the forward drop voltage Vf(Q0) occurs between the base and the emitter of the parasitic transistor Q0, the parasitic transistor Q0 turns on and a current is drawn from the drain of the transistor M2 (and hence from the gate of the transistor M1). Consequently, despite the gate control by the operational amplifier AMP, the transistor M1 turns on erroneously, and this may lead to malfunctioning or destruction of the set that incorporates the semiconductor device 100.

What are herein called parasitic factor elements, that is, such elements that are connected to the external terminal T1, at which a negative voltage can occur, and that are potentially involved (can be a factor) in forming the parasitic transistor Q0, include not only an electrostatic protection element (e.g., the Zener diode D1) but also, for example, an N-channel MOS field-effect transistor.

Now, the behavior observed when a negative voltage occurs at the external terminal T1 will be described with reference to the relevant drawing.

Figure 3:
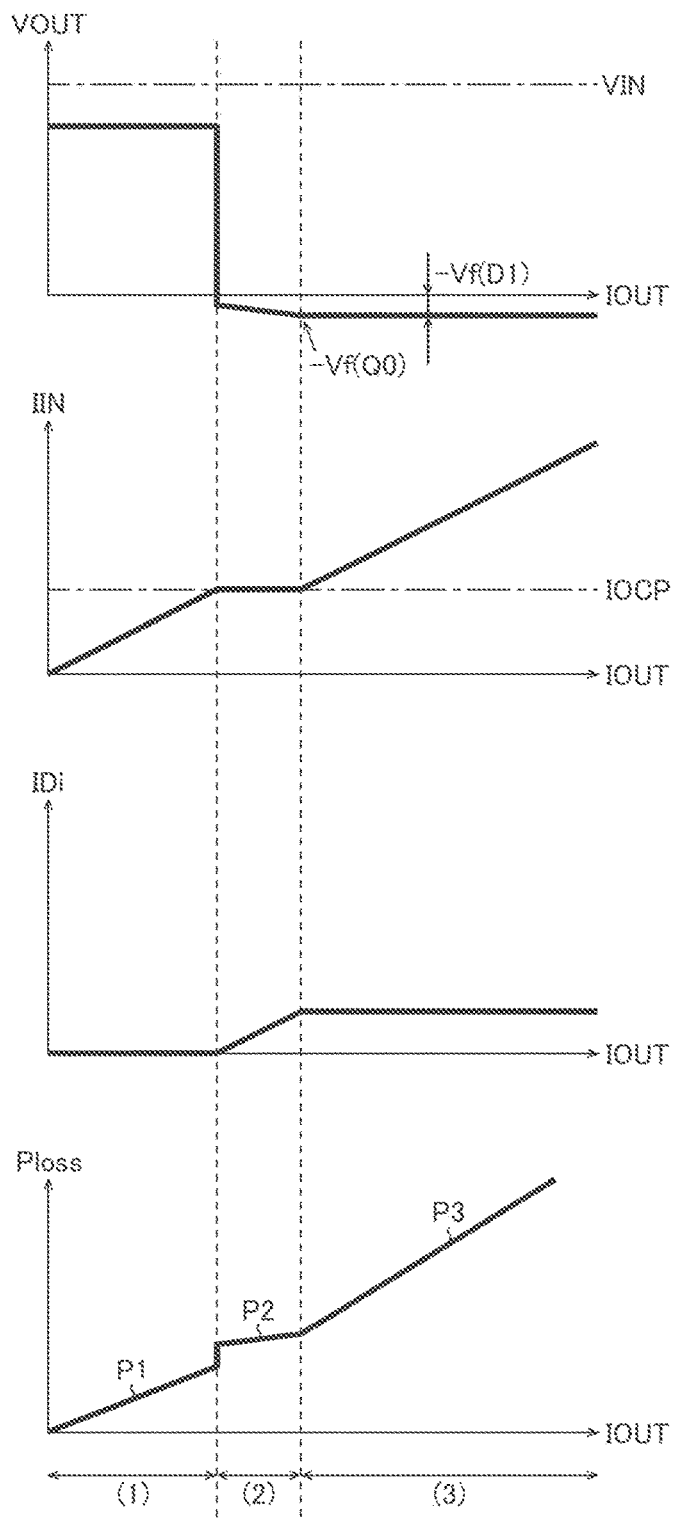
FIG. 3 is a diagram showing behavior observed on occurrence of a negative voltage in the comparative example.

FIG. 3 is a diagram showing the behavior observed when a negative voltage occurs in the comparative example, and shows the correlation of, from top down, the output voltage VOUT, the input current IIN, the diode current IDi, and the power loss Ploss with the output current IOUT.

Period (1) corresponds to a normal-operation period of the semiconductor device 100. That is, during period (1), no negative voltage occurs at the external terminal T1, and the parasitic transistor Q0 does not turn on. When the input current IIN reaches the overcurrent protection value IOCP, the overcurrent protection circuit OCP operates so that no more current will pass. Thus, basically, the input current IIN will not exceed the overcurrent protection value IOCP. During period (1), a power loss Ploss given by P1=(VIN−VOUT)×IOUT occurs.

Period (2) corresponds to a limited-current period owing to the overcurrent protection circuit OCP. If an inductance component is present at the external terminal T1, or when a forcible load test is performed with the external terminal T1, an output current IOUT higher than the overcurrent protection value IOCP may be drawn out via the external terminal T1. When that happens, the input current IIN is limited to the overcurrent protection value IOCP, and thus the deficit current passes as the diode current IDi. Consequently, at the external terminal T1 occurs a negative voltage (=−Vf(D1)) that corresponds to the forward drop voltage Vf(D1) across the Zener diode D1. Even then, during period (2), Vf(D1)<Vf(Q0) still holds, and thus the parasitic transistor Q0 does not turn on. Accordingly, during period (2), a power loss Ploss given by P2=(VIN+Vf(D1))×IOCP+Vf(D1)×(IOUT−IOCP) occurs.

The length of period (2) depends on the layout of, the internal circuits in, and the impedance of the semiconductor device 100. A parasitic element (e.g., the parasitic transistor Q0) may cause malfunctioning of an internal circuit immediately after the occurrence of the negative voltage, or may not cause any malfunctioning at all.

Period (3) corresponds to a malfunctioning period due to a parasitic element. If, as a result of the occurrence of a negative voltage (=−Vf(D1)), a potential difference equal to or larger than the forward drop voltage Vf(Q0) occurs between the base and the emitter of the parasitic transistor Q0 and the parasitic transistor Q0 turns on, an internal circuit can malfunction.

For example, consider a case where, as shown in FIG. 1 referred to previously, the drain of the transistor M2 provided in the output stage of the operational amplifier AMP acts as the collector of the parasitic transistor Q0. In this case, a collector current far higher (e.g., of the order of milliamperes) than the off-state current (e.g., of the order of microamperes) that the overcurrent protection circuit OCP (or the overheat protection circuit TSD) delivers to the gate of the transistor M1 can be drawn from the gate of the transistor M1 to the parasitic transistor Q0.

If that happens, the overcurrent protection circuit OCP can no longer keep the gate signal G1 at high level, and the transistor M1 turns on erroneously. Consequently, the input current IIN (and hence the output current IOUT) increases beyond the overcurrent protection value IOCP, and this may lead to destruction of the semiconductor device 100 and the set that incorporates it.

During period (3), a power loss Ploss given by P3=(VIN+Vf(D1))×(IOUT−Idi)+Vf(D1)×IDi occurs. That is, the higher the input voltage VIN, the higher the power loss Ploss, and hence the more likely the semiconductor device 100 and the set incorporating it are to be destroyed.

Various embodiments that provide a solution to the problem discussed above will be presented below.

Semiconductor Device, First Embodiment

Figure 4:
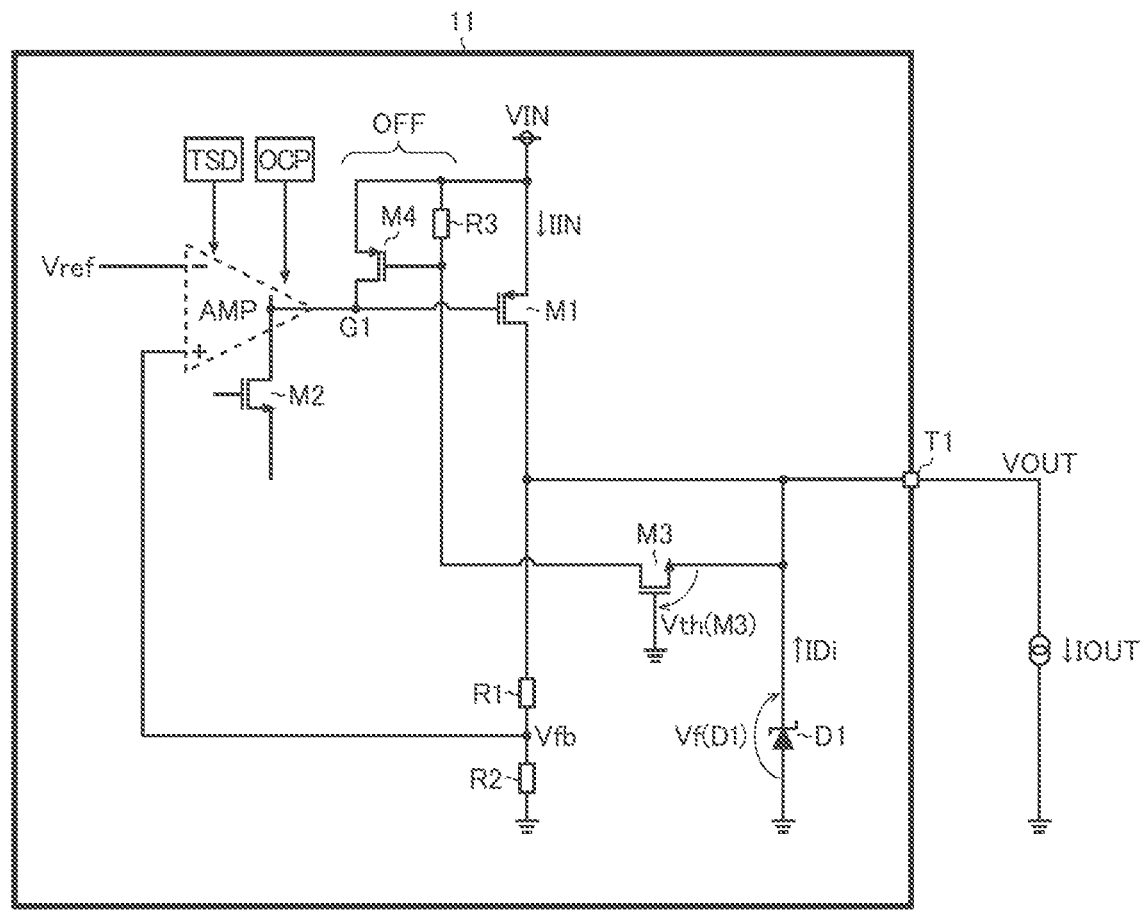
FIG. 4 is a diagram showing a semiconductor device according to a first embodiment.

FIG. 4 is a diagram showing a semiconductor device according to a first embodiment. The semiconductor device 11 of this embodiment is based on the comparative example (FIG. 1) described previously, and additionally includes an N-channel MOS field-effect transistor M3, a P-channel MOS field-effect transistor M4, and a resistor R3.

The gate of the transistor M3 is connected to the grounded terminal (e.g., the P-type semiconductor substrate). The source of the transistor M3 is connected to the external terminal T1. The drain of the transistor M3 is connected to the gate of the transistor M4. So connected, the transistor M3 functions as a detecting element that detects a negative voltage that can occur at the external terminal T1.

The on-threshold voltage Vth(M3) of the transistor M3 can be set to be lower than the base-emitter forward drop voltage Vf(Q0) of the parasitic transistor Q0 (see FIG. 1).

The source of the transistor M4 and the first terminal of the resistor R3 are connected to the source of the transistor M1. The gate of the transistor M4 and the second terminal of the resistor R3 are connected to the drain of the transistor M3. The drain of the transistor M4 is connected to the gate of the transistor M1. So connected, the transistor M4 and the resistor R3 function as an off-circuit OFF that forcibly turns off the transistor M1 when the transistor M3 detects occurrence of a negative voltage. The transistor M4 corresponds to a switch element that short-circuits between the gate and the source of the transistor M1 when the transistor M3 detects occurrence of a negative voltage.

Figure 5:
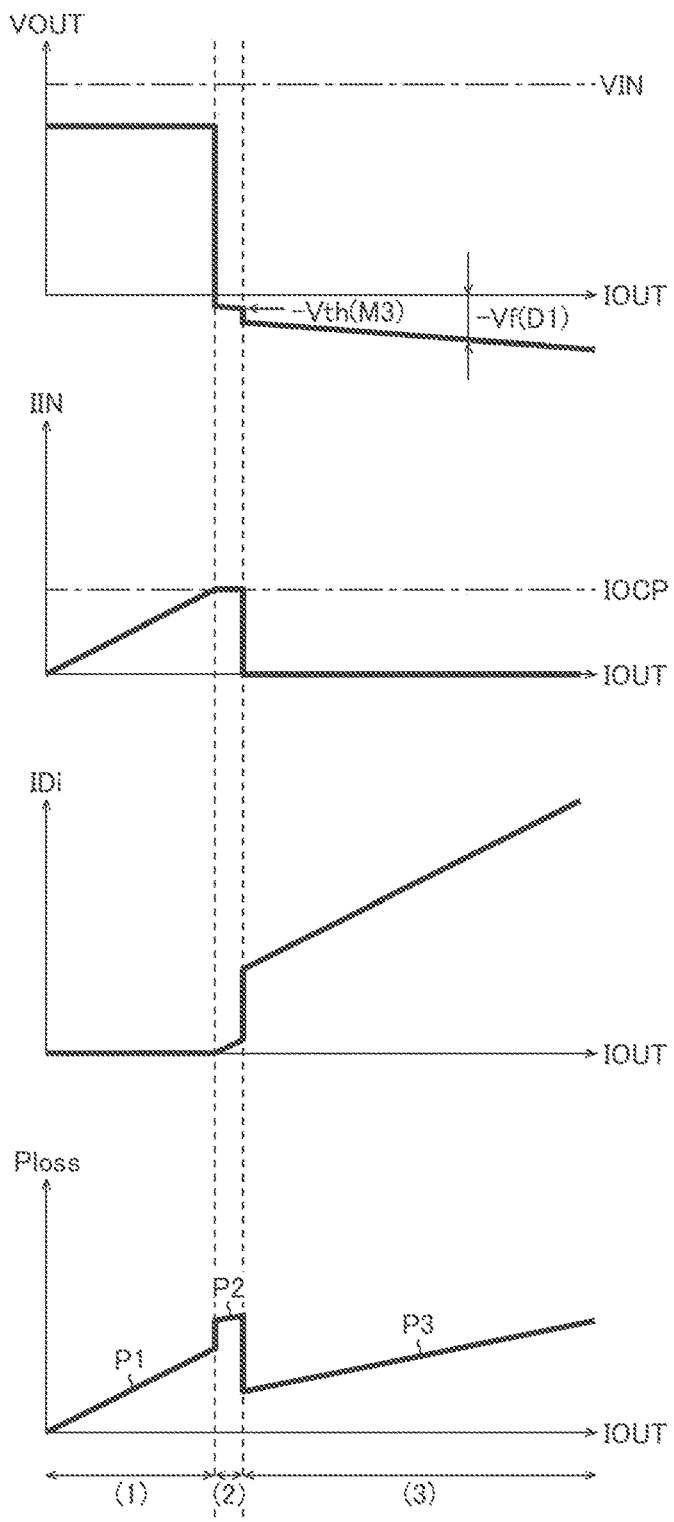
FIG. 5 is a diagram showing behavior observed on occurrence of a negative voltage in the first embodiment.

FIG. 5 is a diagram showing the behavior observed when a negative voltage occurs in the first embodiment, and shows, like FIG. 3 referred to previously, the correlation of, from top down, the output voltage VOUT, the input current IIN, the diode current IDi, and the power loss Ploss with the output current IOUT.

Period (1) corresponds to a normal-operation period of the semiconductor device 11. That is, during period (1), no negative voltage occurs at the external terminal T1, and the parasitic transistor Q0 does not turn on. Nor does transistor M3 turn on during period (1), and thus the gate of the transistor M4 is pulled up to the input voltage VIN via the resistor R3. Accordingly, the transistor M4 is off, and thus the off-circuit OFF does not adversely affect the driving control for the transistor M1. During period (1), a power loss Ploss given by P1=(VIN−VOUT)×IOUT occurs. In this way, what takes place during the normal-operation period of the semiconductor device 11 is no different than in the comparative example (see FIG. 3) described previously.

Period (2) corresponds to a limited-current period owing to the overcurrent protection circuit OCP. If an inductance component is present at the external terminal T1, or when a forcible load test is performed with the external terminal T1, an output current IOUT higher than the overcurrent protection value IOCP may be drawn out via the external terminal T1. When that happens, the input current IIN is limited to the overcurrent protection value IOCP, and thus the deficit current passes as the diode current IDi. Consequently, at the external terminal T1 occurs a negative voltage (=−Vf(D1)) that corresponds to the forward drop voltage Vf(D1) across the Zener diode D1. Even then, during period (2), Vf(D1) <Vth(M3) still holds, and thus the transistor M3 does not turn on. Accordingly, during period (2), a power loss Ploss given by P2=(VIN+Vf(D1))×IOCP+Vf(D1)×(IOUT−IOCP) occurs.

In this way, also what takes place during the limited-current period owing to the overcurrent protection circuit OCP is basically not different than in the comparative example (see FIG. 3) described previously. However, the on-threshold voltage Vth(M3) of the transistor M3 is set to be lower than the base-emitter forward drop voltage Vf(Q0) of the parasitic transistor Q0 (see FIG. 1). Thus, before the parasitic transistor Q0 turns on, the transistor M3 turns on, followed by a transition to period (3), which will be described below. Accordingly, the length of period (2) is shorter than in the comparative example (see FIG. 3) described previously, and can have hardly any length as the case may be.

Period (3) corresponds to an output-off period resulting from detection of a negative voltage. As the diode current IDi increases, the output voltage VOUT decreases further in the negative direction until, when a potential difference larger than the on-threshold voltage Vth(M3) occurs between the gate and the source of the transistor M3, the transistor M3 turns on. This state corresponds to a state where the detecting element (i.e., the transistor M3) has detected occurrence of a negative voltage.

When the transistor M3 turns on, the gate of the transistor M4 is fed with the negative voltage (=−Vth(M3)) at the external terminal T1, and thus the transistor M4 turns on. As a result, the gate and the source of the transistor M1 are short-circuited together; thus the transistor M1 is forcibly turned off, and the input current IIN is cut off.

With the gate and the source of the transistor M1 short-circuited together in this way, even if the parasitic transistor Q0 turns on and a current is drawn from the drain of the transistor M2 (hence from the gate of the transistor M1), the transistor M1 can reliably be kept off.

During period (3), the output current IOUT drawn out via the external terminal T1 is all dispensed from the diode current IDi, and thus, unlike in the comparative example (FIG. 3) described previously, only a power loss Ploss as low as given by P3=Vf(D1)×IOUT occurs. In other words, the power loss Ploss no longer depends on the input voltage VIN.

Accordingly, even when the input voltage VIN is high, owing to the low forward drop voltage Vf(D1) across the Zener diode D1, it is possible to keep the power loss Ploss low, and hence to prevent destruction of the semiconductor device 11 and the set that incorporates it.

Semiconductor Device, Second Embodiment

Figure 6:
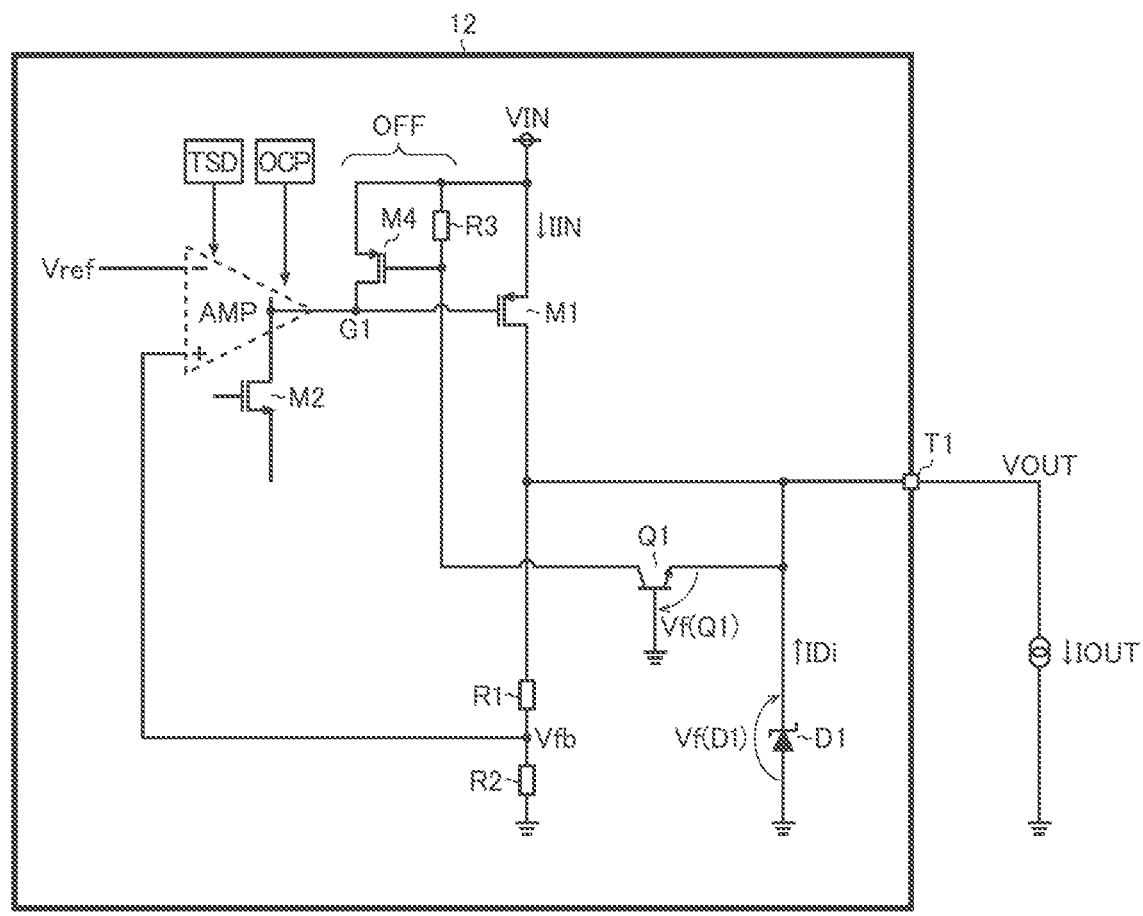
FIG. 6 is a diagram showing a semiconductor device according to a second embodiment.

FIG. 6 is a diagram showing a semiconductor device according to a second embodiment. The semiconductor device 12 of this embodiment is based on the first embodiment (FIG. 4) described previously, and includes, in place of the transistor M3, an npn-type bipolar transistor Q1.

The interconnection around the transistor Q1 will be specifically described. The base of the transistor Q1 is connected to the grounded terminal (e.g., the P-type semiconductor substrate). The emitter of the transistor Q1 is connected to the external terminal T1. The collector of the transistor Q1 is connected to the gate of the transistor M4. So connected, the transistor Q1 functions as a detecting element that detects a negative voltage that can occur at the external terminal T1.

The base-emitter forward drop voltage Vf(Q1) of the transistor Q1 can be set to be lower than the base-emitter forward drop voltage Vf(Q0) of the parasitic transistor Q0 (see FIG. 1).

Figure 7:
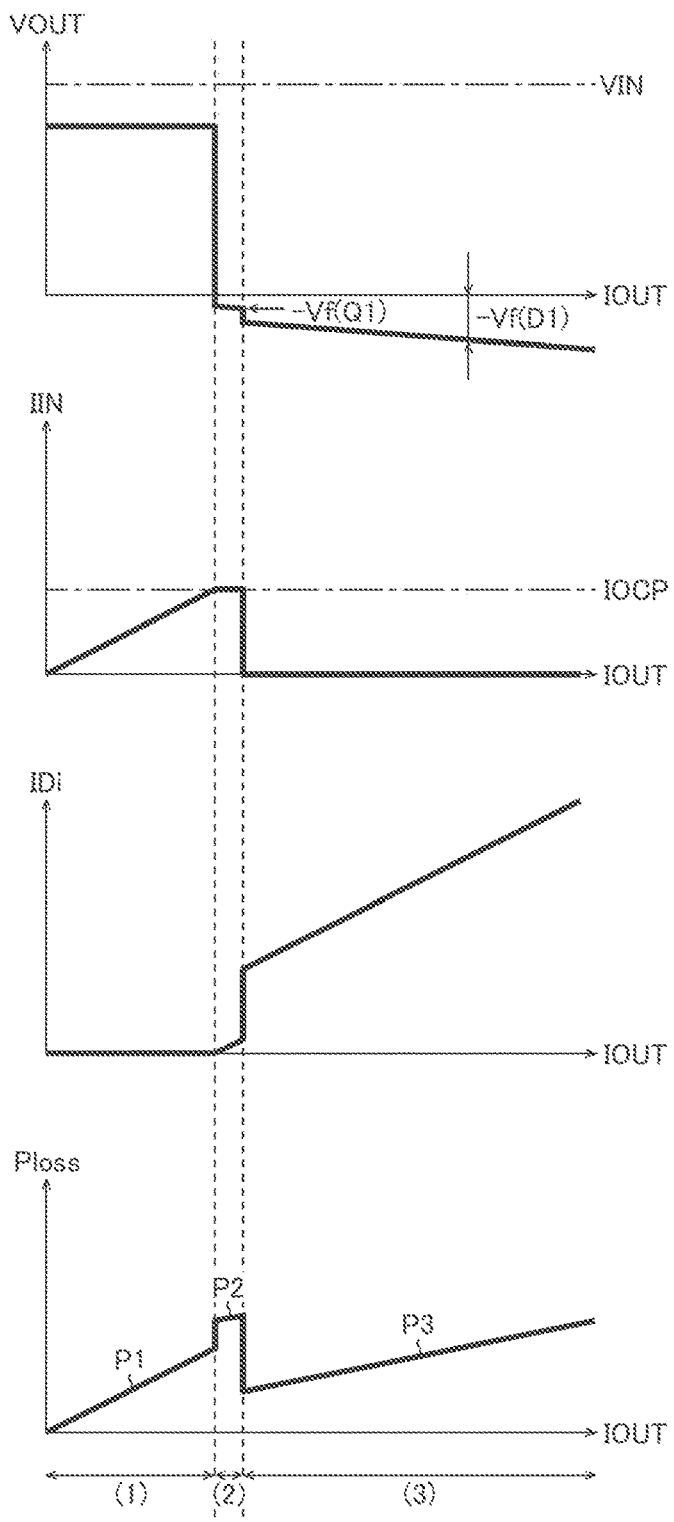
FIG. 7 is a diagram showing behavior observed on occurrence of a negative voltage in the second embodiment.

FIG. 7 is a diagram showing the behavior observed when a negative voltage occurs in the second embodiment, and shows, like FIGS. 3 and 5 referred to previously, the correlation of, from top down, the output voltage VOUT, the input current IIN, the diode current IDi, and the power loss Ploss with the output current IOUT. As shown there, when a potential difference larger than the forward drop voltage Vf(Q1) occurs between the base and the emitter of the transistor Q1, the transistor Q1 turns on, followed by a transition from period (2) to period (3). Except for this, the behavior in the second embodiment is basically similar to that in the first embodiment (see FIG. 5).

Semiconductor Device, Third Embodiment

Figure 8:
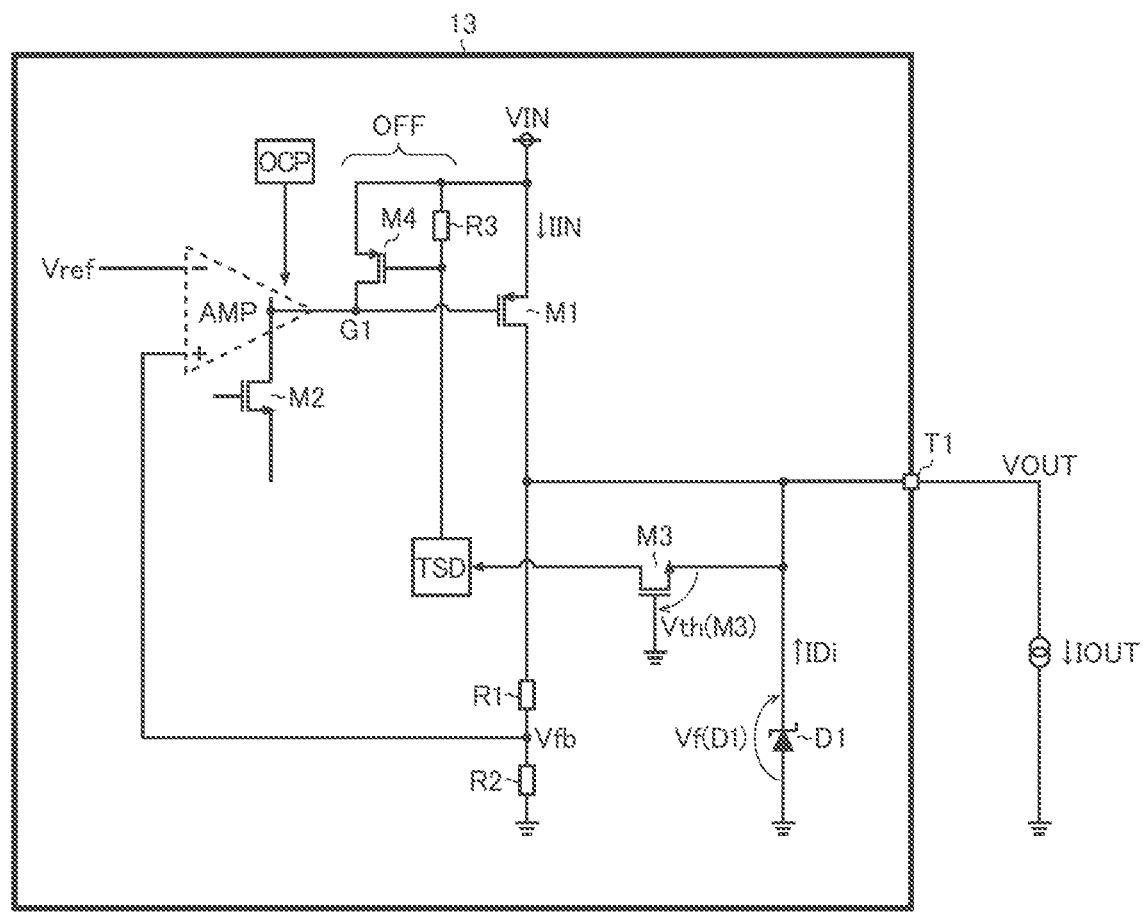
FIG. 8 is a diagram showing a semiconductor device according to a third embodiment.

FIG. 8 is a diagram showing a semiconductor device according to a third embodiment. The semiconductor device 13 of this embodiment is based on the first embodiment (FIG. 4) described previously, and is so configured that, when a negative voltage is detected, the off-circuit OFF is controlled via a fault protection circuit (e.g., the overheat protection circuit TSD).

For example, in this embodiment, the overheat protection circuit TSD is provided with a function of, when the junction temperature Tj of the semiconductor device 13 is higher than the overheat protection value Ttsd, forcibly turning off the transistor M1 not by controlling the operational amplifier AMP but by controlling the off-circuit OFF (transistor M4).

In a case where, in this way, the overheat protection circuit TSD is provided with a function of controlling the off-circuit OFF, the drain of the transistor M3 can be connected to the overheat protection circuit TSD so that, not only when overheating is detected, but also when a negative voltage is detected (i.e., when the transistor M3 is on), the overheat protection circuit TSD will operate. With this configuration, it is possible to forcibly turn off the transistor M1 without duplicating the off-circuit OFF.

The behavior on occurrence of a negative voltage in the third embodiment is quite similar to that in the first embodiment (FIG. 5), and therefore no overlapping description will be repeated.

The fault protection circuit as the principal controlling agent for the off-circuit OFF is not limited to the overheat protection circuit TSD, but can instead be the overcurrent protection circuit OCP or an overvoltage protection circuit OVP; that is, it can be any fault protection circuit regardless of its originally intended monitoring target so long as it is provided with a function of forcibly turning off the transistor M1 via the off-circuit OFF not only when the fault protection circuit itself detects a fault in its own monitoring target but also when the transistor M3 detects occurrence of a negative voltage.

Though not expressly illustrated, a configuration is also possible that is based on the second embodiment (FIG. 6) described previously and where, when a negative voltage is detected (i.e., when the transistor Q1 is on), the off-circuit OFF is controlled via a fault protection circuit. In that case, the behavior on occurrence of a negative voltage is similar to that in the second embodiment (FIG. 7).

Semiconductor Device, Fourth Embodiment

Figure 9:
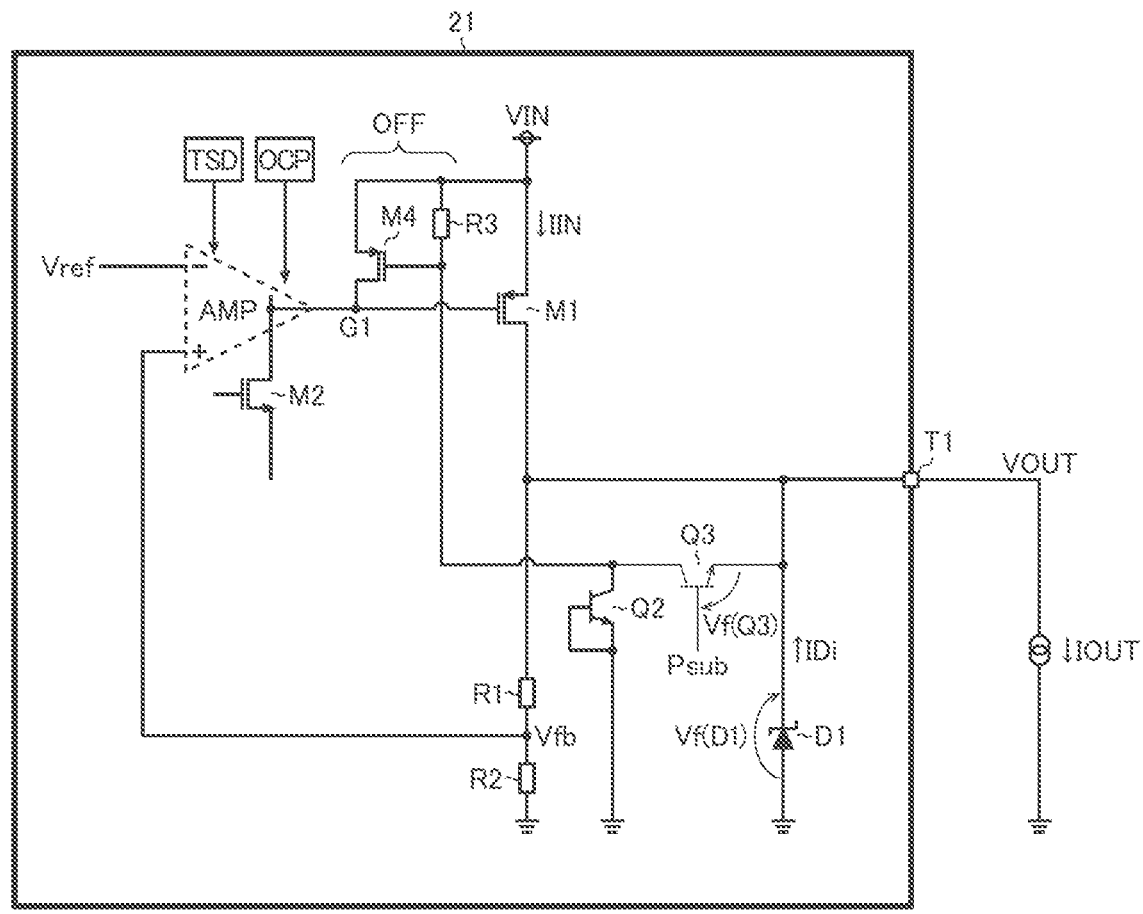
FIG. 9 is a diagram showing a semiconductor device according to a fourth embodiment.

FIG. 9 is a diagram showing a semiconductor device according to a fourth embodiment. The semiconductor device 21 of this embodiment is based on the comparative example (FIG. 1) described previously, and further includes an npn-type bipolar transistor Q2, a P-channel MOS field-effect transistor M4, and a resistor R3.

The base and the emitter of the transistor Q2 are connected to the grounded terminal (e.g., the P-type semiconductor substrate). The collector of the transistor Q2 is connected to the gate of the transistor M4. So connected, the transistor Q2 functions as a dummy element that is kept off all the time. Here, the transistor Q2 is formed between the Zener diode D1 and the transistor M2 (at a position closer to the Zener diode D1 than the transistor M2 is), and between the cathode of the Zener diode D1 and the collector of the transistor Q2, a parasitic transistor Q3 forms (details will be given later).

The source of the transistor M4 and the first terminal of the resistor R3 are connected to the source of the transistor M1. The gate of the transistor M4 and the second terminal of the resistor R3 are connected to the collector of the transistor Q2 (and hence to the collector of the parasitic transistor Q3). The drain of the transistor M4 is connected to the gate of the transistor M1. So connected, the transistor M4 and the resistor R3 function as an off-circuit OFF that forcibly turns off the transistor M1 when the parasitic transistor Q3 is on. The transistor M4 corresponds to a switch element that short-circuits between the gate and the source of the transistor M1 when the parasitic transistor Q3 is on.

The parasitic transistor Q3 will now be described further with reference to a plan-view layout and a vertical section, both schematic, of the semiconductor device 21.

Figure 10:
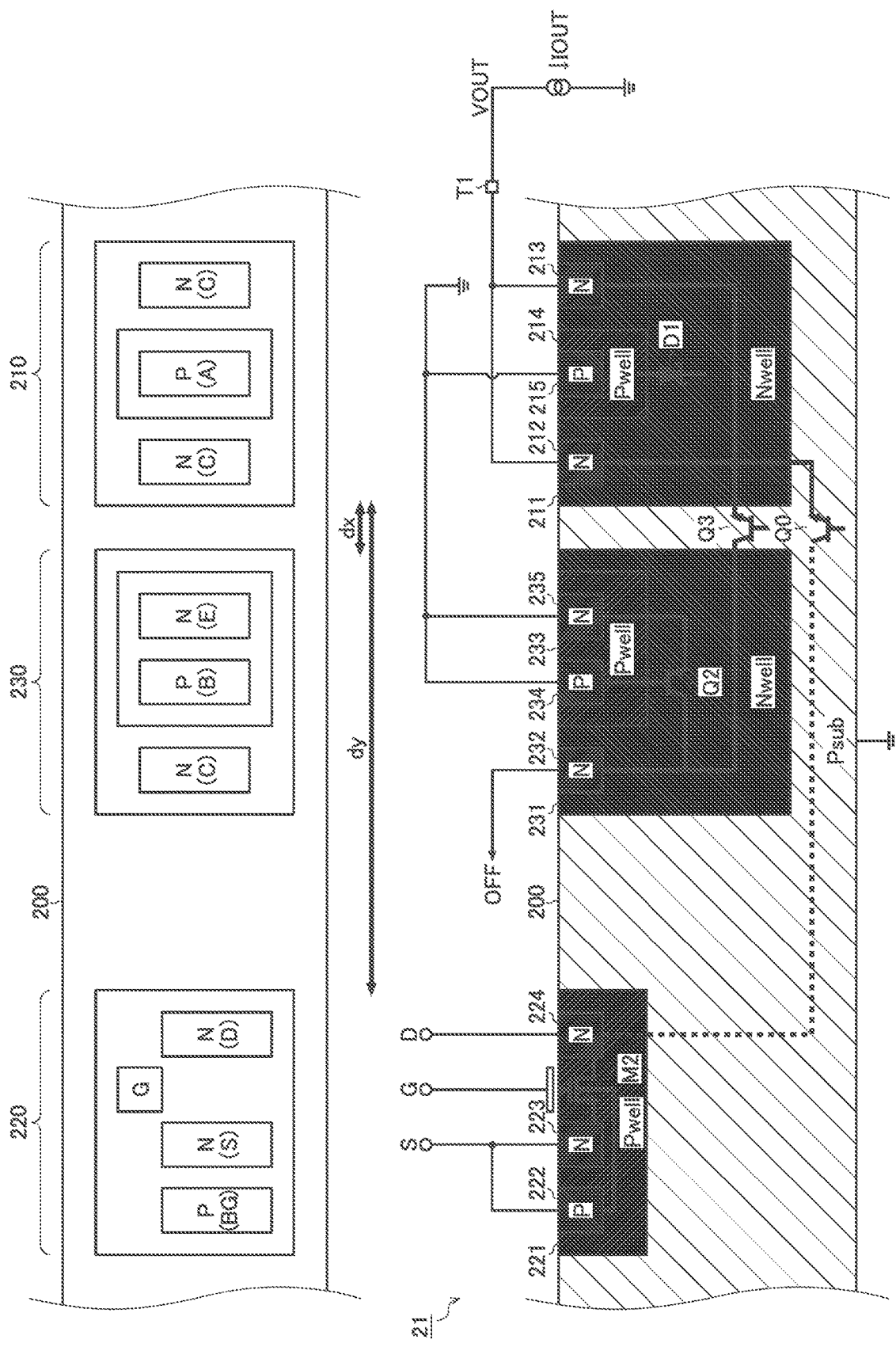
FIG. 10 is a diagram showing a plan-view layout and a vertical section of a semiconductor device.

FIG. 10 is a diagram showing a plan-view layout (at top) and a vertical section (at bottom) of the semiconductor device 21. As shown there, in the P-type semiconductor substrate 200 of the semiconductor device 21, a plurality of element formation regions are formed (of which three, namely element formation regions 210, 220, and 230, are shown in FIG. 10).

The element formation region 210 corresponds to a formation region for an electrostatic protection element (e.g. the Zener diode D1). In the element formation region 210 in the P-type semiconductor substrate 200, an N-type semiconductor well 211 is formed. In the N-type semiconductor well 211, N-type semiconductor contacts 212 and 213 are formed. In the N-type semiconductor well 211, also a P-type semiconductor well 214 is formed. In the P-type semiconductor well 214, a P-type semiconductor contact 215 is formed.

The N-type semiconductor well 211 corresponds to the cathode (C) of the Zener diode D1, and is connected via the N-type semiconductor contacts 212 and 213 to the external terminal T1. The N-type semiconductor well 211 and the N-type semiconductor contacts 212 and 213 can be understood to be a first, N-type, semiconductor region that is connected to the external terminal T1. On the other hand, the P-type semiconductor well 214 corresponds to the anode (A) of the Zener diode D1, and is connected via the P-type semiconductor contact 215 to the grounded terminal.

The element formation region 220 corresponds to a formation region for an internal circuit (e.g., the transistor M2). In the element formation region 220 in the P-type semiconductor substrate 200, a P-type semiconductor well 221 is formed. In the P-type semiconductor well 221, a P-type semiconductor contact 222 is formed. In the P-type semiconductor well 221, also N-type semiconductor regions 223 and 224 are formed.

The N-type semiconductor regions 223 and 224 correspond to the source (S) and the drain (D) of the transistor M2, and on the channel region between them, a gate (G) is formed with an insulating layer interposed. The N-type semiconductor regions 223 and 224 can be understood as a second, N-type, semiconductor region that forms the internal circuit. On the other hand, the P-type semiconductor well 221 corresponds to the backgate (BG) of the transistor M2, and is connected via the P-type semiconductor contact 222 to the source of the transistor M2 (i.e., the N-type semiconductor region 223).

The element formation region 230 corresponds to a formation region for a dummy element (e.g., the transistor Q2).

As shown in FIG. 10, the element formation region 230 is arranged closer to the element formation region 210 than the element formation region 220 is (e.g., between the element formation regions 210 and 220). In other words, the distance dx between the element formation regions 210 and 230 is smaller than the distance dy between the element formation regions 210 and 220.

In the element formation region 230 in the P-type semiconductor substrate 200, an N-type semiconductor well 231 is formed. In the N-type semiconductor well 231, an N-type semiconductor contact 232 is formed. In the N-type semiconductor well 231, also a P-type semiconductor well 233 is formed. In the P-type semiconductor well 233, a P-type semiconductor contact 234 and an N-type semiconductor region 235 are formed.

The N-type semiconductor well 231 corresponds to the collector (C) of the transistor Q2, and is connected via the N-type semiconductor contact 232 to the off-circuit OFF (more specifically, to the gate of the transistor M4). The N-type semiconductor well 231 and the N-type semiconductor contact 232 are understood as a third semiconductor region that is formed between the first semiconductor region (i.e., the N-type semiconductor well 211 and the N-type semiconductor contact 212) and the second semiconductor region (i.e., the N-type semiconductor regions 223 and 224). On the other hand, the P-type semiconductor well 233 corresponds to the base (B) of the transistor Q2, and is connected via the P-type semiconductor contact 234 to the grounded terminal. The N-type semiconductor region 235 corresponds to the emitter (E) of the transistor Q2, and is connected to the grounded terminal.

It should be noted that the dummy element formed in the element formation region 230 is not limited to an npn-type bipolar transistor Q2; it can be any dummy element so long as it has an N-type semiconductor region (corresponding to the third semiconductor region) that acts as the collector of the parasitic transistor Q3, examples including a pnp-type bipolar transistor, an N-channel MOS field-effect transistor, and P-channel MOS field-effect transistor.

As the dummy element, an N-type semiconductor region alone (e.g., the N-type semiconductor wells 231 and 232 alone) can be formed. That is, the dummy element does not need to be an element that functions on its own.

In the semiconductor device 21 having the device structure described above, the parasitic transistor Q3 is formed as an npn-type bipolar transistor resulting from the P-type semiconductor substrate 200 acting as a base, the N-type semiconductor well 211 and the N-type semiconductor contacts 212 and 213 (i.e., the cathode of the Zener diode D1) acting as an emitter, and the N-type semiconductor well 231 or the N-type semiconductor contact 232 (i.e., the collector of the transistor Q2) acting as a collector.

In the semiconductor device 21 accompanied by the parasitic transistor Q3 as described above, for example, if an output current IOUT higher than the overcurrent protection value IOCP is drawn out via the external terminal T1, a forward diode current IDi (=IOUT−IOCP) passes from the grounded terminal via the Zener diode D1 to the external terminal T1. Consequently, at the external terminal T1 occurs a negative voltage (=−Vf(D1)) that corresponds to the forward drop voltage Vf(D1) across the Zener diode D1.

If, as a result of the occurrence of the above negative voltage, a potential difference equal to or larger than the forward drop voltage Vf(Q3) occurs between the base and emitter of the parasitic transistor Q3, the parasitic transistor Q3 turns on. Now, the parasitic transistor Q3 starts to draw current, and acting as its collector here is an N-type semiconductor region located closer relative to the N-type semiconductor region acting as the emitter (i.e., the N-type semiconductor well 211 and the N-type semiconductor contacts 212 and 213).

In terms of what is shown in FIG. 10, before the parasitic transistor Q0 starts to draw current from the drain of the transistor M2 (i.e., the N-type semiconductor region 224), the parasitic transistor Q3 starts to draw current from the collector of the transistor Q2 (i.e., the N-type semiconductor well 231 and the N-type semiconductor contact 232). That is, the parasitic transistor Q3 starts to draw current first from the dummy element which is located closer to the electrostatic protection element than the internal circuit is. Consequently, the off-circuit OFF operates, and the transistor M1 is forcibly turned off. The behavior observed on occurrence of a negative voltage as just mentioned will now be described specifically with reference to the relevant drawing.

Figure 11:
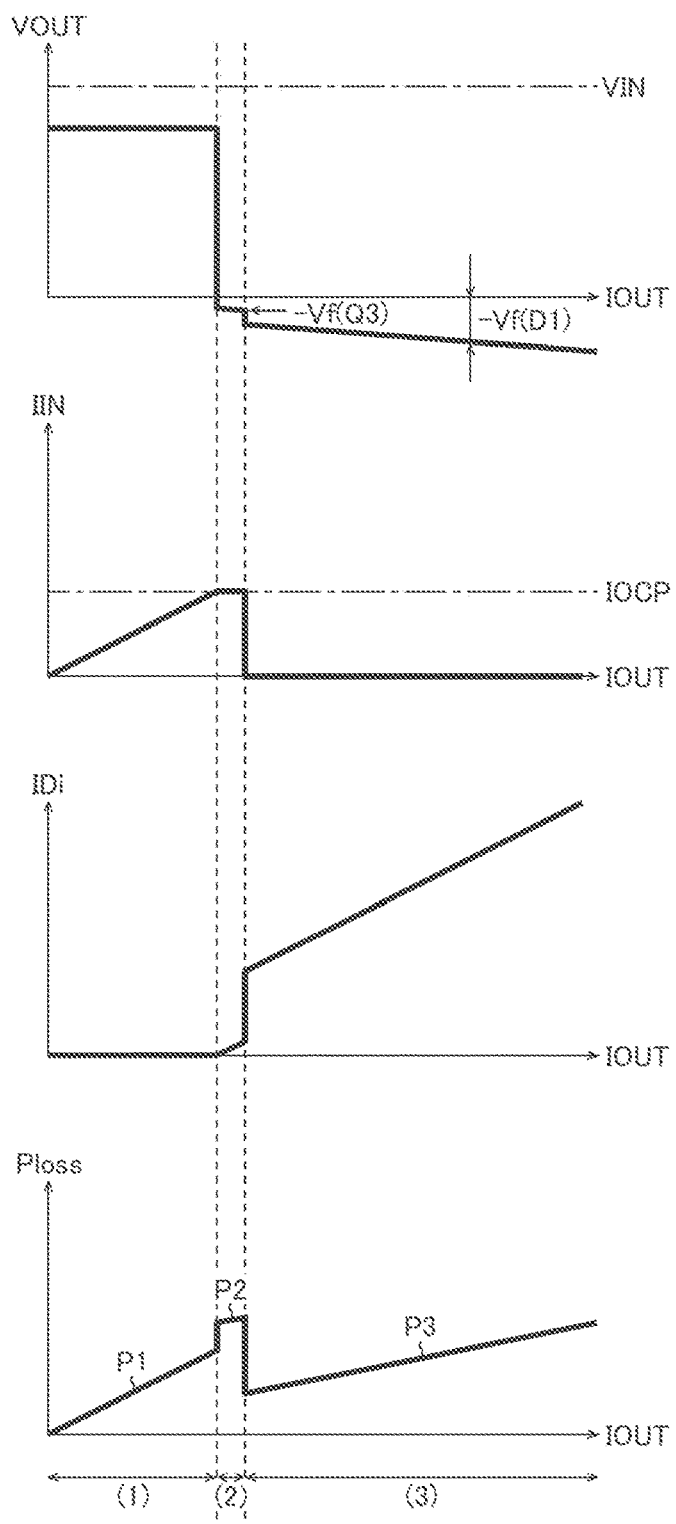
FIG. 11 is a diagram showing behavior observed on occurrence of a negative voltage in the fourth embodiment.

FIG. 11 is a diagram showing the behavior observed when a negative voltage occurs in the fourth embodiment, and shows, like FIG. 3 referred to previously, the correlation of, from top down, the output voltage VOUT, the input current IIN, the diode current IDi, and the power loss Ploss with the output current IOUT.

Period (1) corresponds to a normal-operation period of the semiconductor device 21. That is, during period (1), no negative voltage occurs at the external terminal T1, and the parasitic transistor Q3 does not turn on; thus, the gate of the transistor M4 is pulled up to the input voltage VIN via the resistor R3. Accordingly, the transistor M4 is off, and thus the off-circuit OFF does not adversely affect the driving control of the transistor M1. During period (1), a power loss Ploss given by P1=(VIN−VOUT)×IOUT occurs. In this way, what takes place during the normal-operation period of the semiconductor device 21 is no different than in the comparative example (see FIG. 3) described previously.

Period (2) corresponds to a limited-current period owing to the overcurrent protection circuit OCP. As mentioned earlier, if an inductance component is present at the external terminal T1, or when a forcible load test is performed with the external terminal T1, an output current IOUT higher than the overcurrent protection value IOCP may be drawn out via the external terminal T1. When that happens, the input current IIN is limited to the overcurrent protection value IOCP, and thus the deficit current passes as the diode current IDi. Consequently, at the external terminal T1 occurs a negative voltage (=−Vf(D1)) that corresponds to the forward drop voltage Vf(D1) across the Zener diode D1. Even then, during period (2), Vf(D1)<Vf(Q3) still holds, and thus the parasitic transistor Q3 does not turn on. Accordingly, during period (2), a power loss Ploss given by P2=(VIN+Vf(D1))× IOCP+Vf(D1)×(IOUT−IOCP) occurs.

In this way, also what takes place during the limited-current period owing to the overcurrent protection circuit OCP is basically not different than in the comparative example (see FIG. 3) described previously. However, the timing with which the parasitic transistor Q3 starts to draw current from the collector of the transistor Q2 is earlier than the timing with which the parasitic transistor Q0 starts to draw current from the drain of the transistor M2. Accordingly, the length of period (2) is shorter than in the comparative example (see FIG. 3) described previously.

Period (3) corresponds to an output-off period resulting from parasitic operation. As the diode current IDi increases, the output voltage VOUT decreases further in the negative direction until, when a potential difference larger than the forward drop voltage Vf(Q3) occurs between the base and the emitter of the parasitic transistor Q3, the parasitic transistor Q3 turns on.

When the parasitic transistor Q3 turns on, the gate of the transistor M4 is fed with the negative voltage (=−Vf(Q3)) at the external terminal T1, and thus the transistor M4 turns on. As a result, the gate and the source of the transistor M1 are short-circuited together; thus the transistor M1 is forcibly turned off, and the input current IIN is cut off.

With the gate and the source of the transistor M1 short-circuited together in this way, even if the parasitic transistor Q0 thereafter starts to draw current from the drain of the transistor M2 (hence from the gate of the transistor M1), the transistor M1 can reliably be kept off so long as the transistor M4 has a sufficient current capacity.

During period (3), the output current IOUT drawn out via the external terminal T1 is all dispensed from the diode current IDi, and thus, unlike in the comparative example (FIG. 3) described previously, only a power loss Ploss as low as given by P3=Vf(D1)×IOUT occurs. In other words, the power loss Ploss no longer depends on the input voltage VIN.

Accordingly, even when the input voltage VIN is high, owing to the low forward drop voltage Vf(D1) across the Zener diode D1, it is possible to keep the power loss Ploss low, and hence to prevent destruction of the semiconductor device 21 and the set that incorporates it.

Semiconductor Device, Fifth Embodiment

Figure 12:
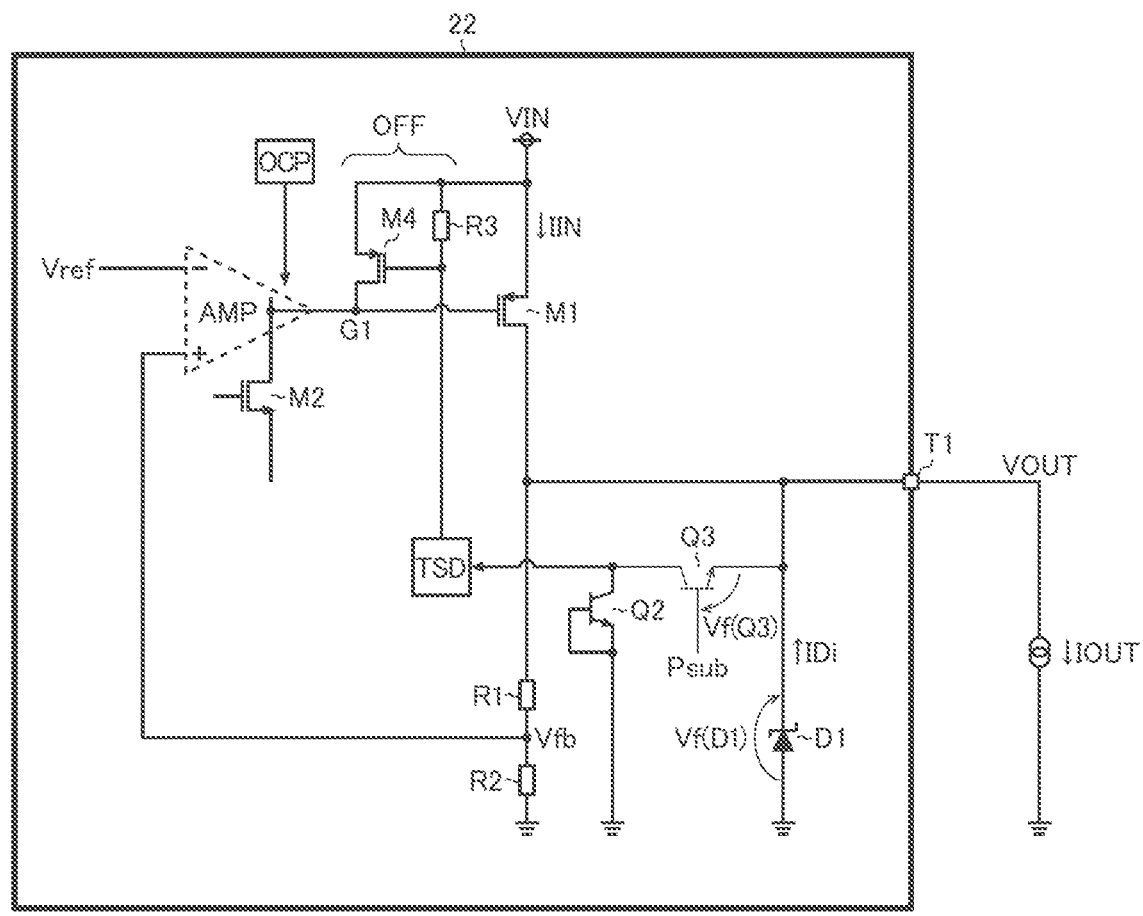
FIG. 12 is a diagram showing a semiconductor device according to a fifth embodiment.

FIG. 12 is a diagram showing a semiconductor device according to a fifth embodiment. The semiconductor device 22 of this embodiment is based on the fourth embodiment (FIG. 9) described previously, and is so configured that, when a parasitic element is on, the off-circuit OFF is controlled via a fault protection circuit (e.g., the overheat protection circuit TSD).

For example, in this embodiment, the overheat protection circuit TSD is provided with a function of, when the junction temperature Tj of the semiconductor device 22 is higher than the overheat protection value Ttsd, forcibly turning off the transistor M1 not by controlling the operational amplifier AMP but by controlling the off-circuit OFF (transistor M4).

In a case where, in this way, the overheat protection circuit TSD is provided with a function of controlling the off-circuit OFF, the collector of the transistor Q2 (and hence the collector of the parasitic transistor Q3) can be connected to the overheat protection circuit TSD so that, not only when overheating is detected, but also when the parasitic transistor Q3 is on, the overheat protection circuit TSD will operate. With this configuration, it is possible to forcibly turn off the transistor M1 without duplicating the off-circuit OFF.

The behavior on occurrence of a negative voltage in the fifth embodiment is quite similar to that in the fourth embodiment (FIG. 11), and therefore no overlapping description will be repeated.ad The fault protection circuit as the principal controlling agent for the off-circuit OFF is not limited to the overheat protection circuit TSD, but can instead be the overcurrent protection circuit OCP or an overvoltage protection circuit OVP; that is, it can be any fault protection circuit regardless of its originally intended monitoring target so long as it is provided with a function of forcibly turning off the transistor M1 via the off-circuit OFF not only when the fault protection circuit itself detects a fault in its own monitoring target but also when the parasitic transistor Q3 is on.

Semiconductor Device, Sixth Embodiment

FIG. 13 is a diagram showing a semiconductor device according to a sixth embodiment (a plan-view layout at top and an equivalent circuit diagram at bottom). The semiconductor device 23 of this embodiment is based on the fourth embodiment (FIG. 9) or the fifth embodiment (FIG. 12), both described previously, and is so configured as to have, around an electrostatic protection element (i.e., the Zener diode D1) connected to the external terminal T1, a plurality of dummy elements (in FIG. 13, npn-type bipolar transistors Q2a and Q2b).

Consider a case where, as shown in the plan-view layout at top, internal circuits INTa and INTb are arranged in a spread manner in a plurality of directions relative to the Zener diode D1. In such a case, dummy elements (i.e., the transistors Q2a and Q2b) can be formed one between the Zener diode D1 and the internal circuit INTa and another between the Zener diode D1 and the internal circuit INTb.

With this device structure adopted, when a negative voltage occurs at the external terminal T1, at least one of the parasitic elements (i.e., npn-type bipolar transistors Q3a and Q3b) formed between the cathode of the Zener diode D1 and the respective collectors of the transistors Q2a and Q2b turns on first. It is thus possible to make the off-circuit OFF operate reliably.

Even in a case where a plurality of dummy elements are provided, a single common off-circuit OFF suffices. This configuration helps avoid an unnecessary increase in circuit scale.

The plan-view shape of a dummy element is not necessarily limited to a rectangular shape, and can be any shape (such as annular, circular-arc, or curved).

Semiconductor Device, Seventh Embodiment

Figure 14:
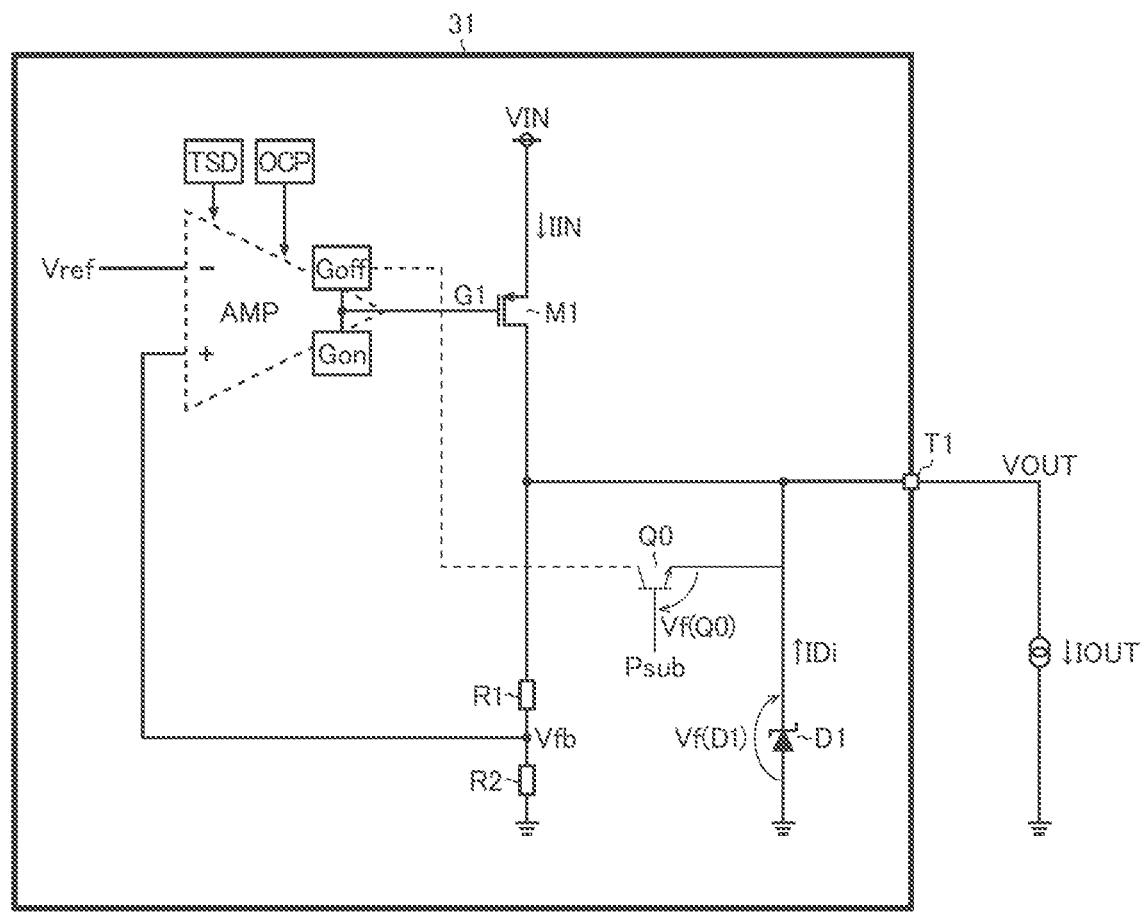
FIG. 14 is a diagram showing a semiconductor device according to a seventh embodiment.

FIG. 14 is a diagram showing a semiconductor device according to a seventh embodiment. The semiconductor device 31 of this embodiment is based on the comparative example (FIG. 1) described previously, and is elaborated in terms of the arrangement layout of the elements constituting the operational amplifier AMP.

The elements constituting the operational amplifier AMP can be classified roughly into on-related elements Gon (corresponding to a first element) and off-related elements Goff (corresponding to a second element).

An on-related element Gon is an element (such as an NMOS, PMOS, npn, or pnp structure) that is accompanied by, between the element itself and the cathode of the Zener diode D1, a parasitic element that, on occurrence of a negative voltage at the external terminal T1, operates so as to turn on the transistor M1, one example being the transistor M2 in FIG. 1.

Accordingly, when a negative voltage occurs at the external terminal T1, if the parasitic element accompanying an on-related element Gon draws current, the operational amplifier AMP erroneously operates so as to turn on the transistor M1. This may lead to destruction of the semiconductor device 31 or the set that incorporates it.

On the other hand, an off-related element Goff is an element (such as an NMOS, PMOS, npn, or pnp structure) that is accompanied by, between the element itself and the cathode of the Zener diode D1, a parasitic element that, on occurrence of a negative voltage at the external terminal T1, operates so as to turn off the transistor M1.

Accordingly, when a negative voltage occurs at the external terminal T1, if the parasitic element accompanying an off-related element Gon draws current, the operational amplifier AMP erroneously operates so as to turn off the transistor M1 (thereby achieving a fail-safe operation contributing to functional safety of the semiconductor device 31). Thus, there is no risk of destruction of the semiconductor device 31 or the set incorporating it.

The current that passes through the parasitic element basically depends on the mutual distance between the N-type semiconductor region acting as the emitter and the N-type semiconductor region acting as the collector.

For example, the parasitic transistor Q0 in FIG. 14 can draw current with any of N-type semiconductor regions formed at different places on the P-type semiconductor substrate acting as the collector; in reality, however, it draws the higher current, and the earlier, from an N-type semiconductor region the closer it is from the emitter of the parasitic transistor Q0 (i.e., the cathode of the Zener diode DD.

In view of the just-mentioned behavior, at least one off-related element Goff is formed closer to the cathode of the Zener diode D1 than any on-related element Gon is. In other words, the distance between the Zener diode D1 and one off-related element Goff is smaller than the distance between the Zener diode D1 and any on-related element Gon. With this arrangement layout adopted, even if a negative voltage occurs at the external terminal T1 and the parasitic transistor Q0 operates, the operational amplifier AMP erroneously operates so as to turn off the transistor M1 (thereby achieving a fail-safe operation). This prevents the semiconductor device 31 and the set incorporating it from destruction.

Now, the on-related and off-related elements Gon and Goff will be described further with reference to a plan-view layout and a vertical section, both schematic, of the semiconductor device 31.

Figure 15:
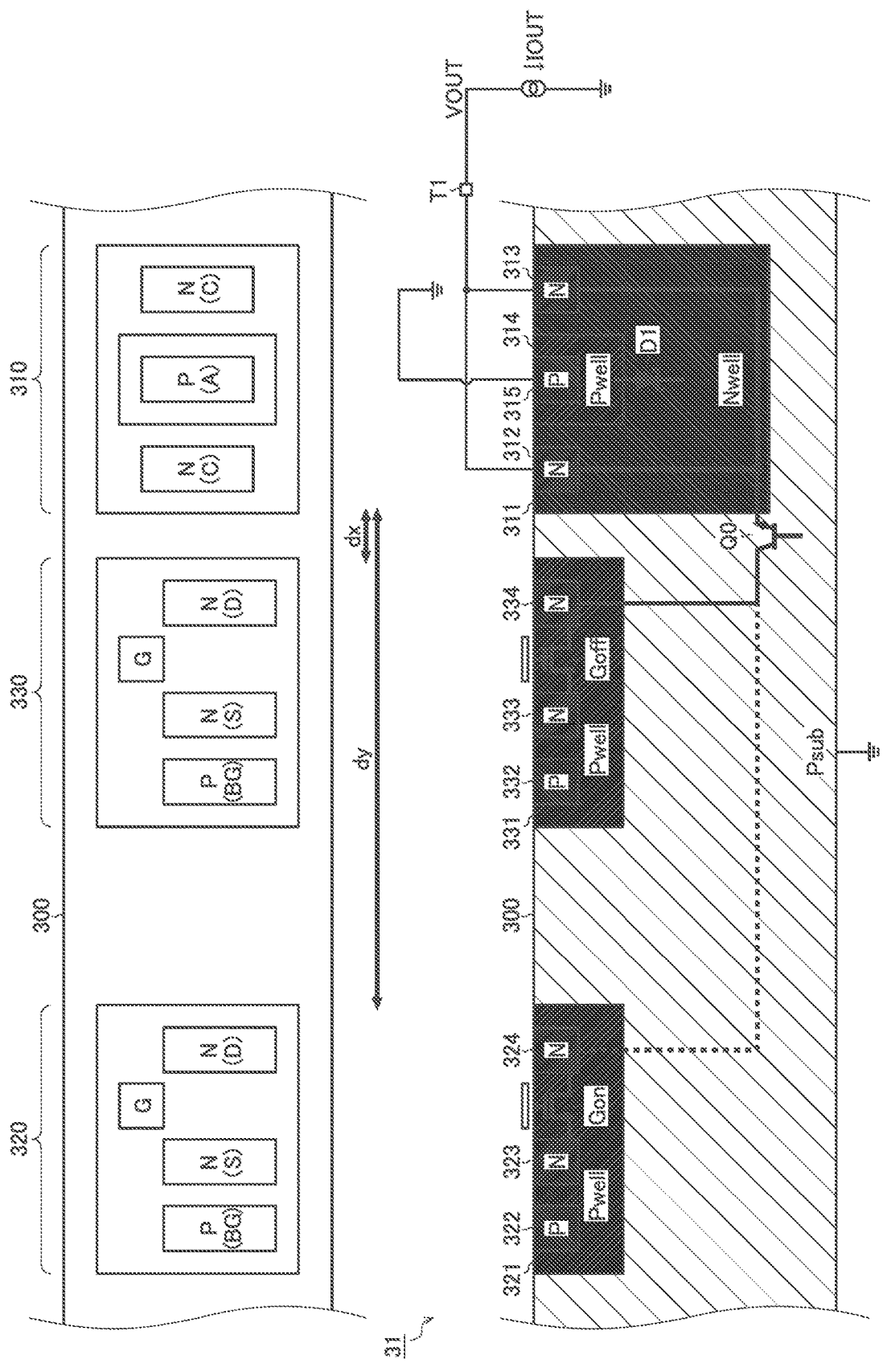
FIG. 15 is a diagram showing a plan-view layout and a vertical section in the seventh embodiment.

FIG. 15 is a diagram showing a plan-view layout (at top) and a vertical section (at bottom) of the semiconductor device 31. As shown there, in the P-type semiconductor substrate 300 of the semiconductor device 31, a plurality of element formation regions are formed (of which three, namely element formation regions 310, 320, and 330, are shown in FIG. 15).

The element formation region 310 corresponds to a formation region for an electrostatic protection element (e.g. the Zener diode D1). In the element formation region 310 in the P-type semiconductor substrate 300, an N-type semiconductor well 311 is formed. In the N-type semiconductor well 311, N-type semiconductor contacts 312 and 313 are formed. In the N-type semiconductor well 311, also a P-type semiconductor well 314 is formed. In the P-type semiconductor well 314, a P-type semiconductor contact 315 is formed.

The N-type semiconductor well 311 corresponds to the cathode (C) of the Zener diode D1, and is connected via the N-type semiconductor contacts 312 and 313 to the external terminal T1. On the other hand, the P-type semiconductor well 314 corresponds to the anode (A) of the Zener diode D1, and is connected via the P-type semiconductor contact 315 to the grounded terminal.

The element formation region 320 corresponds to a formation region for an on-related element Gon (e.g., an NMOSFET). In the element formation region 320 in the P-type semiconductor substrate 300, a P-type semiconductor well 321 is formed. In the P-type semiconductor well 321, a P-type semiconductor contact 322 is formed. In the P-type semiconductor well 321, also N-type semiconductor regions 323 and 324 are formed.

The N-type semiconductor regions 323 and 324 correspond to the source (S) and the drain (D) of the on-related element Gon, and on the channel region between them, a gate (G) is formed with an insulating layer interposed. On the other hand, the P-type semiconductor well 321 and the P-type semiconductor contact 322 correspond to the back-gate (BG) of the on-related element Gon.

The element formation region 330 corresponds to a formation region for an off-related element Goff (e.g., an NMOSFET). As shown in FIG. 15, the element formation region 330 is arranged closer to the element formation region 310 than the element formation region 320 is (e.g., between the element formation regions 310 and 320). In other words, the distance dx between the element formation regions 310 and 330 is smaller than the distance dy between the element formation regions 310 and 320.

In the element formation region 330 in the P-type semiconductor substrate 300, a P-type semiconductor well 331 is formed. In the P-type semiconductor well 331, a P-type semiconductor contact 332 is formed. In the P-type semiconductor well 331, also N-type semiconductor regions 333 and 334 are formed.

The N-type semiconductor regions 333 and 334 correspond to the source (S) and the drain (D) of the off-related element Goff, and on the channel region between them, a gate (G) is formed with an insulating layer interposed. On the other hand, the P-type semiconductor well 331 and the P-type semiconductor contact 332 correspond to the back-gate (BG) of the off-related element Goff.

In the semiconductor device 31 having the device structure described above, the parasitic transistor Q0 is formed as, for example, an npn-type bipolar transistor resulting from the P-type semiconductor substrate 300 acting as a base, the N-type semiconductor well 311 and the N-type semiconductor contacts 312 and 313 (i.e., the cathode of the Zener diode D1) acting as an emitter, and the N-type semiconductor region 334 closest to them (i.e., the drain of the off-related element Goff) acting as a collector.

In the semiconductor device 31 accompanied by the parasitic transistor Q0 described above, for example, if an output current IOUT higher than the overcurrent protection value IOCP is drawn out via the external terminal T1, a forward diode current IDi (=IOUT−IOCP) passes from the grounded terminal via the Zener diode D1 to the external terminal T1. Consequently, at the external terminal T1 occurs a negative voltage (=−Vf(D1)) that corresponds to the forward drop voltage Vf(D1) across the Zener diode D1.

If, as a result of the occurrence of the above negative voltage, a potential difference equal to or larger than the forward drop voltage Vf(Q0) occurs between the base and emitter of the parasitic transistor Q0, the parasitic transistor Q0 turns on. Now, the parasitic transistor Q0 starts to draw current, and acting as its collector here is an N-type semiconductor region located closer relative to the N-type semiconductor region acting as the emitter (i.e., the N-type semiconductor well 311 and the N-type semiconductor contacts 312 and 313).

In terms of what is shown in FIG. 15, before the parasitic transistor Q0 draws current from the drain of the on-related element Gon (i.e., the N-type semiconductor region 324), the parasitic transistor Q0 starts to draw current from the drain of the off-related element Goff (i.e., the N-type semiconductor region 334). Consequently, through the fail-safe operation of the operational amplifier AMP, the transistor M1 turns off. The behavior observed on occurrence of a negative voltage as just mentioned will now be described specifically with reference to the relevant drawing.

Figure 16:
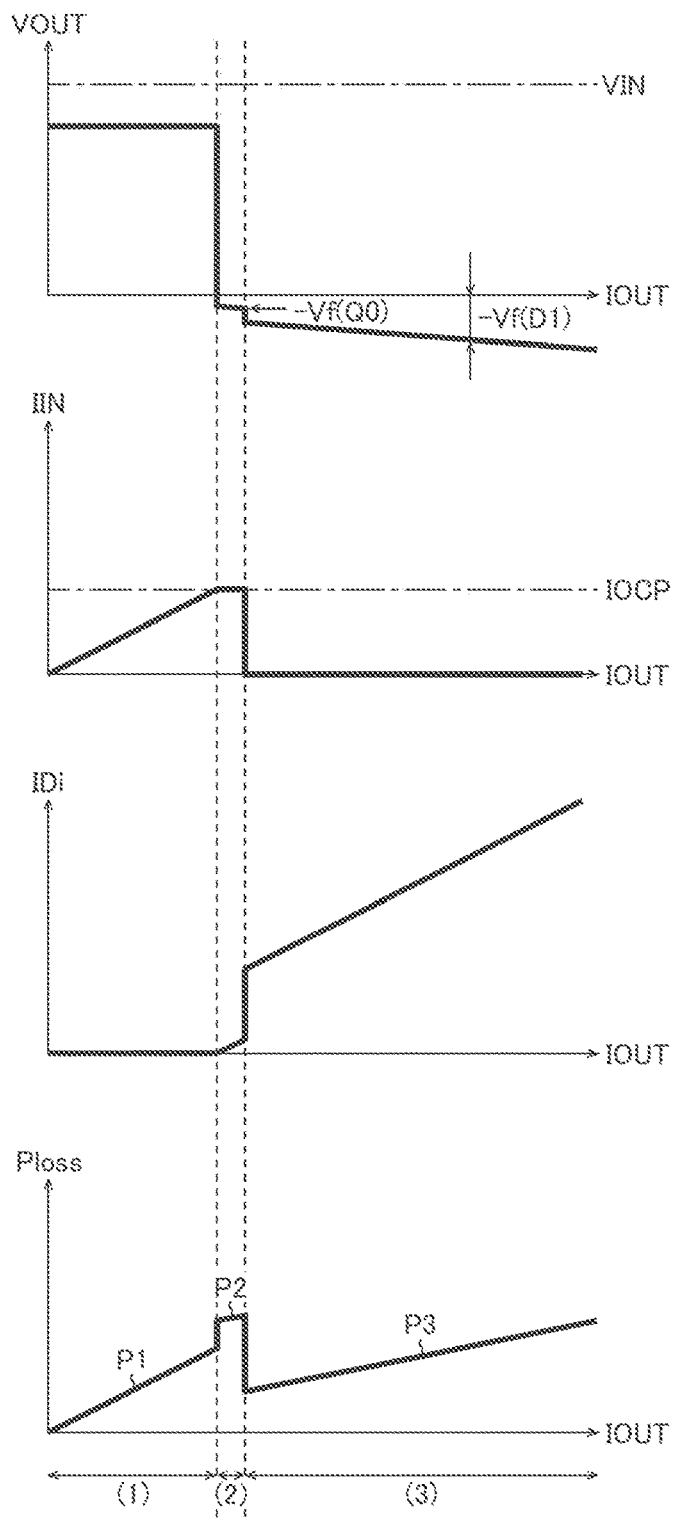
FIG. 16 is a diagram showing behavior observed on occurrence of a negative voltage in the seventh embodiment.

FIG. 16 is a diagram showing the behavior observed when a negative voltage occurs in the seventh embodiment, and shows, like FIG. 3 referred to previously, the correlation of, from top down, the output voltage VOUT, the input current IIN, the diode current IDi, and the power loss Ploss with the output current IOUT.

Period (1) corresponds to a normal-operation period of the semiconductor device 31. That is, during period (1), no negative voltage occurs at the external terminal T1, and the parasitic transistor Q0 does not turn on; thus, the driving operation for the transistor M1 by the operational amplifier AMP is performed as usual. During period (1), a power loss Ploss given by P1=(VIN−VOUT)×IOUT occurs. In this way, what takes place during the normal-operation period of the semiconductor device 31 is no different than in the comparative example (see FIG. 3) described previously.

Period (2) corresponds to a limited-current period owing to the overcurrent protection circuit OCP. As mentioned earlier, if an inductance component is present at the external terminal T1, or when a forcible load test is performed with the external terminal T1, an output current IOUT higher than the overcurrent protection value IOCP may be drawn out via the external terminal T1. When that happens, the input current TIN is limited to the overcurrent protection value IOCP, and thus the deficit current passes as the diode current IDi. Consequently, at the external terminal T1 occurs a negative voltage (=−Vf(D1)) that corresponds to the forward drop voltage Vf(D1) across the Zener diode D1. Even then, during period (2), Vf(D1)<Vf(Q0) still holds, and thus the parasitic transistor Q0 does not turn on. Accordingly, during period (2), a power loss Ploss given by P2=(VIN+Vf(D1))×IOCP+Vf(D1)×(IOUT−IOCP) occurs.

In this way, also what takes place during the limited-current period owing to the overcurrent protection circuit OCP is basically not different than in the comparative example (see FIG. 3) described previously. However, the timing with which the parasitic transistor Q0 starts to draw current from the collector of the off-related element Goff is earlier than the timing with which the parasitic transistor Q0 starts to draw current from the drain of the on-related element Gon (e.g., the transistor M2). Accordingly, the length of period (2) is shorter than in the comparative example (see FIG. 3) described previously.

Period (3) corresponds to an output-off period resulting from parasitic operation. As the diode current IDi increases, the output voltage VOUT decreases further in the negative direction until, when a potential difference larger than the forward drop voltage Vf(Q0) occurs between the base and the emitter of the parasitic transistor Q0, the parasitic transistor Q0 starts to draw current from the drain of the off-related element Goff. Consequently, through the fail-safe operation of the operational amplifier AMP, the transistor M1 turns off; thus the input current IIN is cut off.

During period (3), the output current IOUT drawn out via the external terminal T1 is all dispensed from the diode current IDi, and thus, unlike in the comparative example (FIG. 3) described previously, only a power loss Ploss as low as given by P3=Vf(D1)×IOUT occurs. In other words, the power loss Ploss no longer depends on the input voltage VIN.

Accordingly, even when the input voltage VIN is high, owing to the low forward drop voltage Vf(D1) across the Zener diode D1, it is possible to keep the power loss Ploss low, and hence to prevent destruction of the semiconductor device 31 and the set that incorporates it.

Semiconductor Device, Eighth Embodiment

Figure 17:
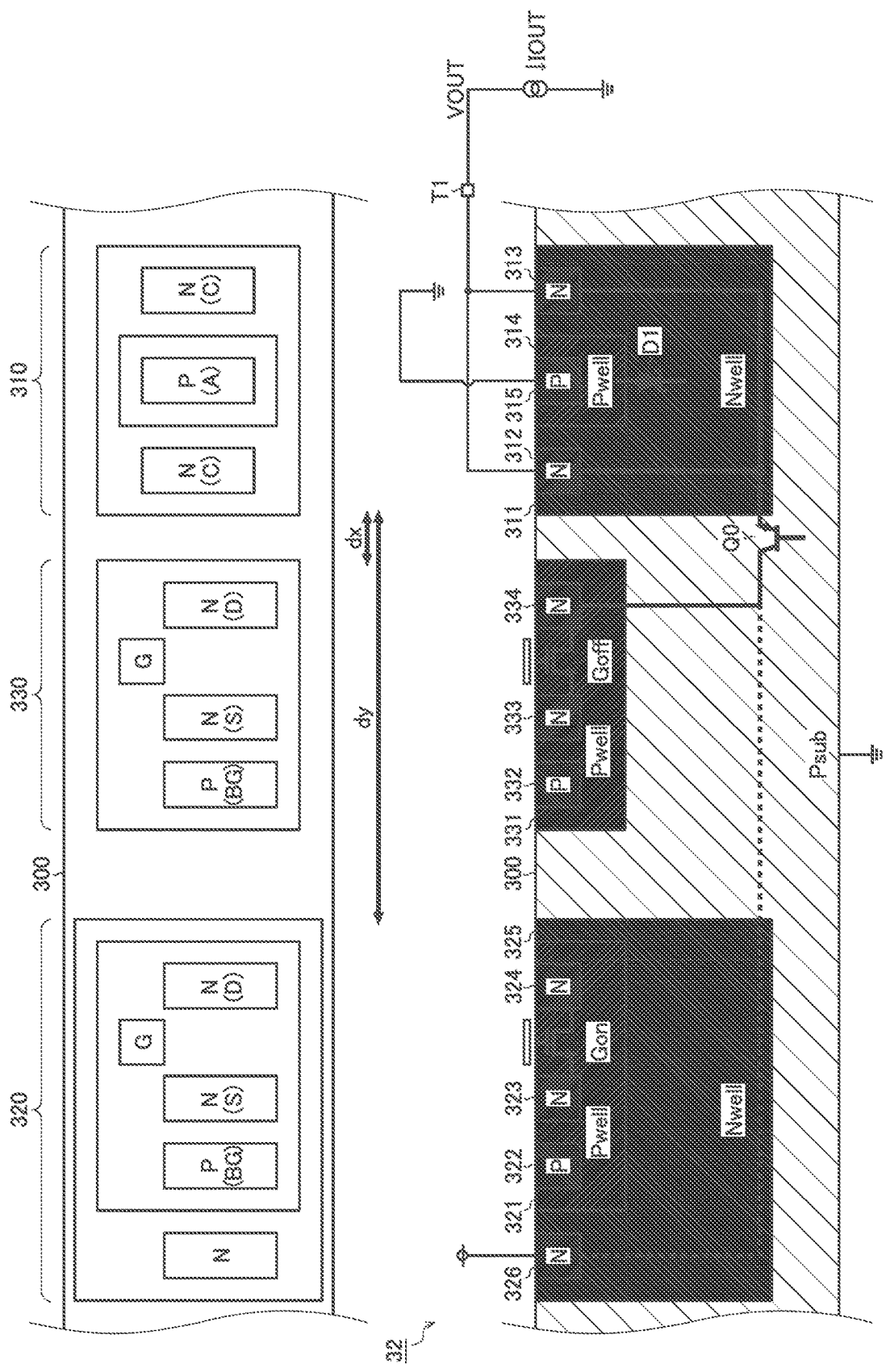
FIG. 17 is a diagram showing a semiconductor device according to an eighth embodiment.

FIG. 17 is a diagram showing a semiconductor device according to an eighth embodiment (a plan-view layout at top and a vertical section at bottom). The semiconductor device 32 of this embodiment is based on the seventh embodiment (FIGS. 14 and 15), and is so configured as to have an on-related element Gon with a floating structure.

Specifically, in the element formation region 320 in the P-type semiconductor substrate 300, i.e., where an on-related element Gon is formed, an N-type semiconductor well 325 (corresponding to an element separating region) is formed so as to surround the P-type semiconductor well 321 mentioned previously. The N-type semiconductor well 325 is connected via an N-type semiconductor contact 326 to a low-impedance node (e.g., a power source). That is, the on-related element Gon is surrounded by an element separating region connected to a low-impedance node.

With this device structure adopted, the parasitic transistor Q0 draws current more preferentially from the low-impedance node than from the drain of the on-related element Gon. It is thus possible to more reliably prevent the transistor M1 from erroneously turning on, and thus to increase the safety of the semiconductor device 32 and the set that incorporates it.

The behavior on occurrence of a negative voltage in the eighth embodiment is quite similar to that in the seventh embodiment (FIG. 16), and therefore no overlapping description will be repeated.

Figure 18:
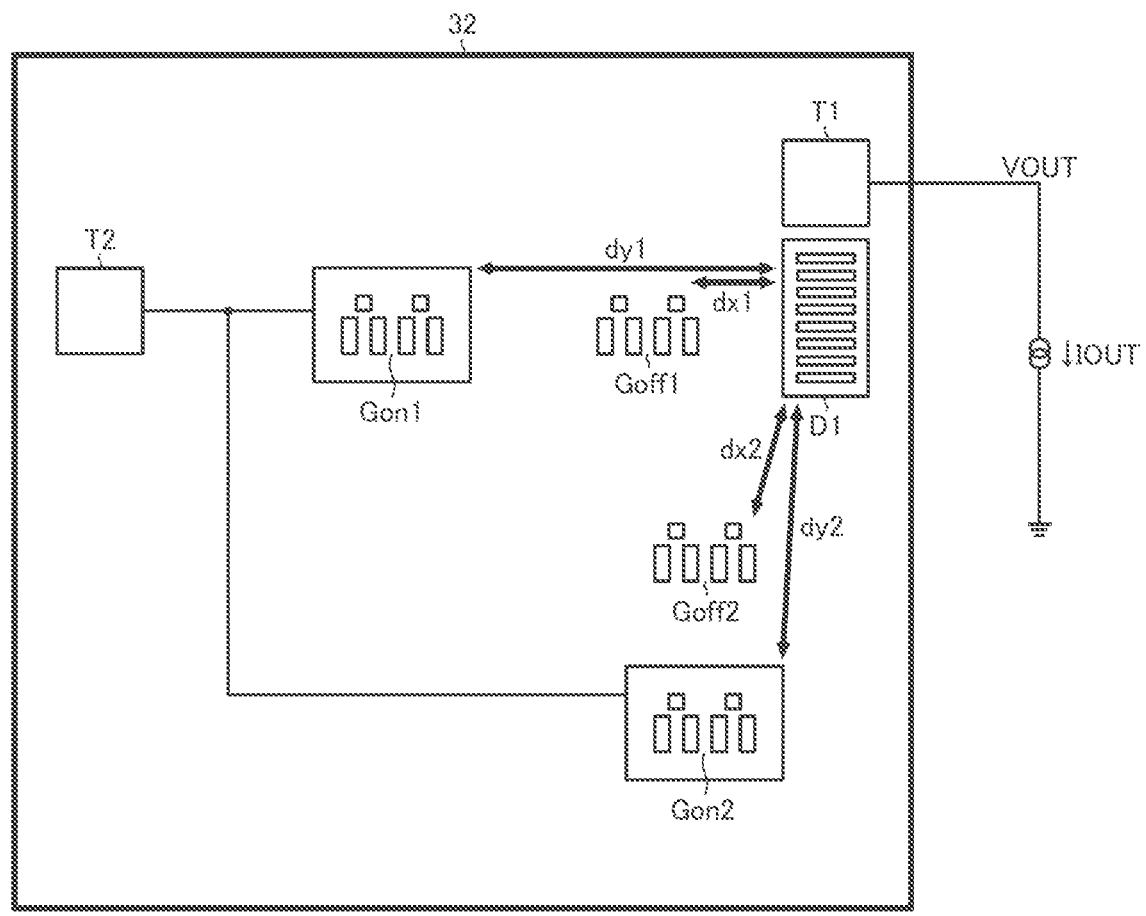
FIG. 18 is a diagram showing one modified example of a plan-view layout in the eighth embodiment.

FIG. 18 is a diagram showing one modified example of the plan-view layout in the eighth embodiment. Consider a case where, as shown there, on-related elements Gon1 and Gon2 are arranged in a spread manner in a plurality of directions relative to the Zener diode D1. In such a case, off-related elements Goff1 and Goff2 can be formed one between the Zener diode D1 and the on-related element Gon1 and another between the Zener diode D1 and the on-related element Gon2.

Then the distance dx1 between the Zener diode D1 and the off-related element Goff1 and the distance dx2 between the Zener diode D1 and the off-related element Goff2 are respectively smaller than the distance dy1 between the Zener diode D1 and the on-related element Gon1 and the distance dy2 between the Zener diode D1 and the on-related element Gon2.

The on-related elements Gon1 and Gon2 can each be given a floating structure as described above by being surrounded each by an element separating region (N-type semiconductor region) connected to a low-impedance node (e.g., an external terminal T2 connected to a power source).

With this device structure adopted, if a negative voltage occurs at the external terminal T1, the parasitic elements respectively formed between the cathode of the Zener diode D1 and the drains of the off-related elements Goff1 and Goff2 turn on first. It is thus possible to reliably prevent the transistor M1 from erroneously turning on.

Semiconductor Device, Ninth Embodiment

Figure 19:
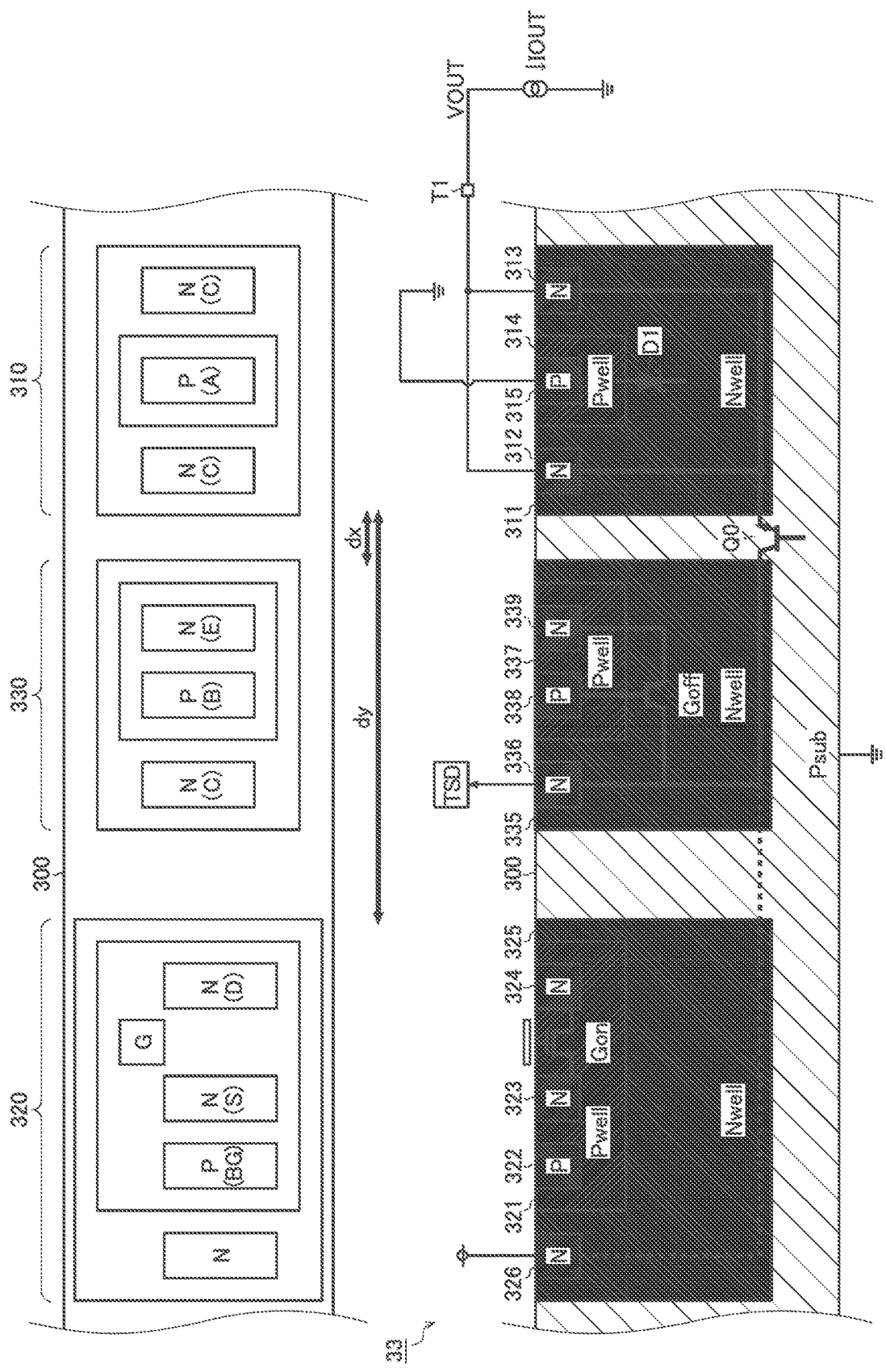
FIG. 19 is a diagram showing a semiconductor device according to a ninth embodiment.

FIG. 19 is a diagram showing a semiconductor device according to a ninth embodiment (a plan-view layout at top and a vertical section at bottom). The semiconductor device 33 of this embodiment is based on the seventh embodiment (FIG. 14) or the eighth embodiment (FIG. 17), both described previously, and is so configured that, when a parasitic element that accompanies an off-related element Goff operates, the transistor M1 is forcibly turned off via a fault protection circuit (e.g., the overheat protection circuit TSD). In this case, the off-related element Goff can be understood to be not a circuit element of the operational amplifier AMP but a circuit element of the fault protection circuit.

In the element formation region 330 in the P-type semiconductor substrate 300, i.e., where, for example, an off-related element Goff (in the diagram, an npn-type bipolar transistor) is formed, an N-type semiconductor well 335 is formed. In the N-type semiconductor well 335, an N-type semiconductor contact 336 is formed. In the N-type semiconductor well 335, also a P-type semiconductor well 337 is formed. In the P-type semiconductor well 337, a P-type semiconductor contact 338 and an N-type semiconductor region 339 are formed.

The N-type semiconductor well 335 and the N-type semiconductor contact 336 correspond to the collector (C) of the off-related element Goff, and are connected to, for example, the overheat protection circuit TSD. On the other hand, the P-type semiconductor well 337 and the P-type semiconductor contact 338 correspond to the base (B) of the off-related element Goff. The N-type semiconductor region 339 corresponds to the emitter (E) of the off-related element Goff.

In the semiconductor device 33 having the device structure described above, the parasitic transistor Q0 is formed as an npn-type bipolar transistor resulting from the P-type semiconductor substrate 300 acting as a base, the N-type semiconductor well 311 and the N-type semiconductor contacts 312 and 313 (i.e., the cathode of the Zener diode D1) acting as an emitter, and the N-type semiconductor well 335 or the N-type semiconductor contact 336 (the collector of the off-related element Goff) acting as a collector.

The overheat protection circuit TSD is provided with a function of forcibly turning off the transistor M1 not only when the junction temperature Tj of the semiconductor device 33 is higher than the overheat protection value Ttsd but also when the parasitic transistor Q0 that accompanies the off-related element Goff operates.

As described above, the off-related element Goff that is to be arranged near the Zener diode D1 does not necessarily have to be a circuit element of the operational amplifier AMP but can instead be a circuit element of, for example, a fault protection circuit.

The fault protection circuit that forcibly turns off the transistor M1 is not limited to the overheat protection circuit TSD, but can instead be an overcurrent protection circuit OCP or an overvoltage protection circuit OVP; that is, it can be any fault protection circuit regardless of its originally intended monitoring target so long as it is provided with a function of forcibly turning off the transistor M1 not only when the fault protection circuit itself detects a fault in its own monitoring target but also when the parasitic transistor Q0 turns on.

The behavior on occurrence of a negative voltage in the ninth embodiment is quite similar to that in the seventh embodiment (FIG. 16), and therefore no overlapping description will be repeated.

Semiconductor Device, Tenth Embodiment

Figure 20:
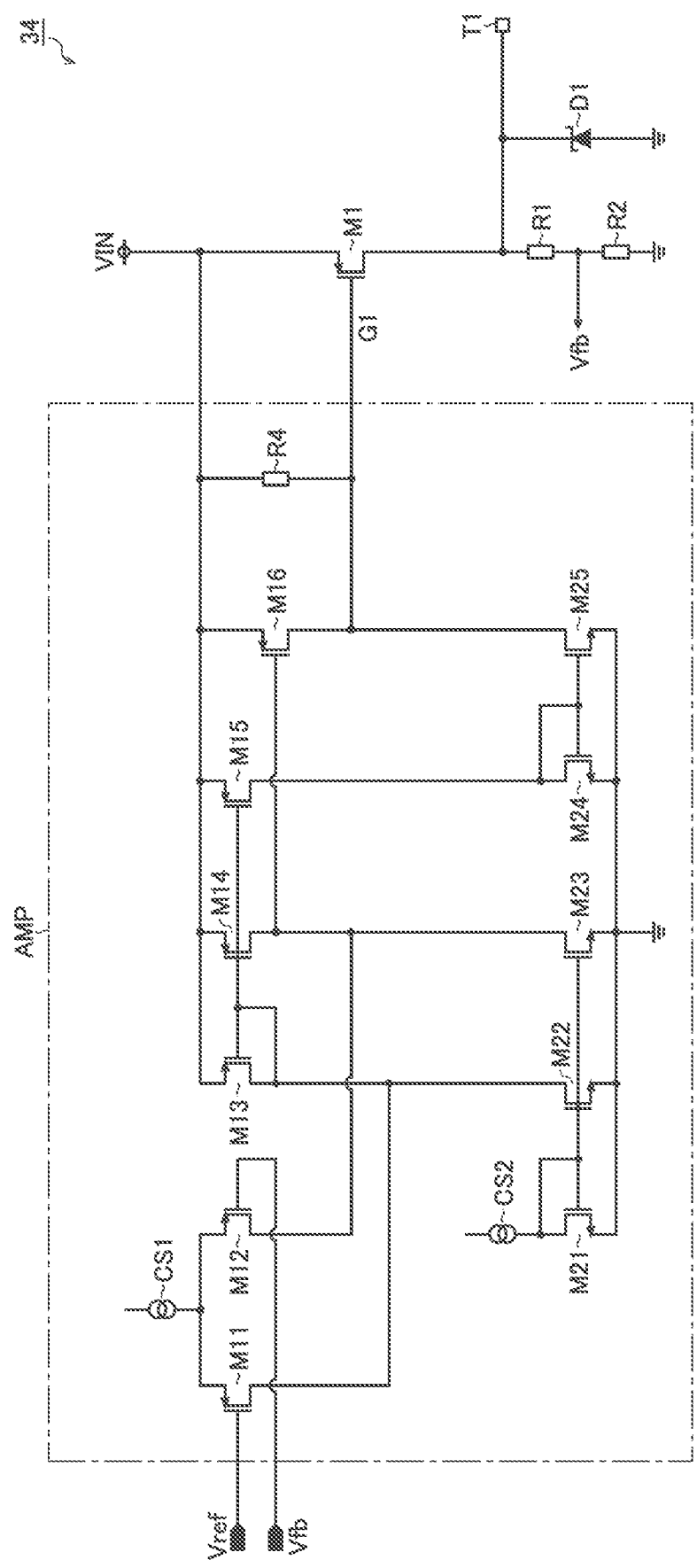
FIG. 20 is a diagram showing a semiconductor device according to a tenth embodiment.

FIG. 20 is a diagram showing a semiconductor device according to a tenth embodiment. The semiconductor device 34 of this embodiment is based on the seventh embodiment (FIG. 14) or the eighth embodiment (FIG. 17), both described previously, and is elaborated by way of a specific example of the circuit configuration of the operational amplifier AMP.

In terms of what is shown in FIG. 20, the operational amplifier AMP includes current sources CS1 and CS2, P-channel MOS field-effect transistors M11 to M16 (corresponding to a first to a sixth PMOSFET), N-channel MOS field-effect transistors M21 to M25 (corresponding to a first to a fifth NMOSFET), and a resistor R4.

The respective sources of the transistors M11 and M12 are both connected to the current source CS1. The gate of the transistor M11 is, as the inverting input terminal (−) of the operational amplifier AMP, connected to an input terminal for a reference voltage Vref (corresponding to a first input terminal). The gate of the transistor M12 is, as the non-inverting input terminal (+) of the operational amplifier AMP, connected to an input terminal for a feedback voltage Vfb (corresponding to a second input terminal).

The respective sources of the transistors M13 to M16 are all connected to the source of the transistor M1. The respective gates of the transistors M13 to M15 are all connected to the drain of the transistor M13. The drain of the transistor M13 is connected to the drain of the transistor M11. The drain of the transistor M14 is connected to the drain of the transistor M12. The gate of the transistor M16 is connected to the drain of the transistor M14. The drain of the transistor M16 is connected to the gate of the transistor M1.

The respective sources of the transistors M21 to M25 are all connected to the grounded terminal (i.e., a reference potential terminal). The respective gates of the transistors M21 to M23 are all connected to the drain of the transistor M21. The drain of the transistor M21 is connected to the current source CS2. The drain of the transistor M22 is connected to the drain of the transistor M11. The drain of the transistor M23 is connected to the drain of the transistor M12. The respective gates of the transistors M24 and M25 are both connected to the drain of the transistor M24. The drain of the transistor M24 is connected to the drain of the transistor M15. The drain of the transistor M25 is connected to the gate of the transistor M1.

The basic operation of the operational amplifier AMP configured as described above will now be described in brief. When Vfb<Vref, the drain current of the transistor M11 is lower than the drain current of the transistor M12. This results in a higher drain current in the transistor M13, mirrored by a higher drain current in the transistor M14, resulting in a higher gate voltage in the transistor M16. The transistor M16 thus has an higher on-state resistance. The higher drain current in the transistor M13 is mirrored by a higher drain current in the transistors M15 and M24, mirrored by a higher drain current in the transistor M25. Through this sequence of operation, the gate signal G1 to the transistor M1 decreases, reducing the on-state resistance of the transistor M1 and increasing the output voltage VOUT (and hence the feedback voltage Vfb).

In contrast, when Vfb>Vref, the drain current of the transistor M11 is higher than the drain current of the transistor M12. This results in a lower drain current in the transistor M13, mirrored by a lower drain current in the transistor M14, resulting in a lower gate voltage in the transistor M16. The transistor M16 thus has a lower on-state resistance. The lower drain current in the transistor M13 is mirrored by a lower drain current in the transistors M15 and M24, mirrored by a lower drain current in the transistor M25. Through this sequence of operation, the gate signal G1 to the transistor M1 increases, increasing the on-state resistance of the transistor M1 and reducing the output voltage VOUT (and hence the feedback voltage Vfb).

In the operational amplifier AMP configured as described above, for example, if a parasitic element (npn-type bipolar transistor) that forms the drain of the transistor M25 or M22 and the cathode of the Zener diode D1 turns on, the gate signal G1 to the transistor M1 lowers, and thus the transistor M1 may erroneously turn on. That is, the transistors M25 and M22 correspond to on-related elements Gon mentioned previously.

On the other hand, if a parasitic element (npn-type bipolar transistor) that forms between the drain of the transistor M24 or M23 and the cathode of the Zener diode D1 turns on, the gate signal G1 to the transistor M1 rises, and thus the transistor M1 is likely to turn off spontaneously without requiring special control. That is, the transistors M24 and M23 correspond to off-related elements Goff mentioned previously.

Thus, it is preferable that the transistors M23 and M24 be arranged closer to the Zener diode D1 than the transistors M22 and M25 are. Accordingly, in the semiconductor device 23 of this embodiment, the transistors M23 and M24 are arranged near the Zener diode D1, and the transistors M22 and M25 are arranged away from the Zener diode D1. This will be described specifically below with reference to the relevant drawing.

Figure 21:
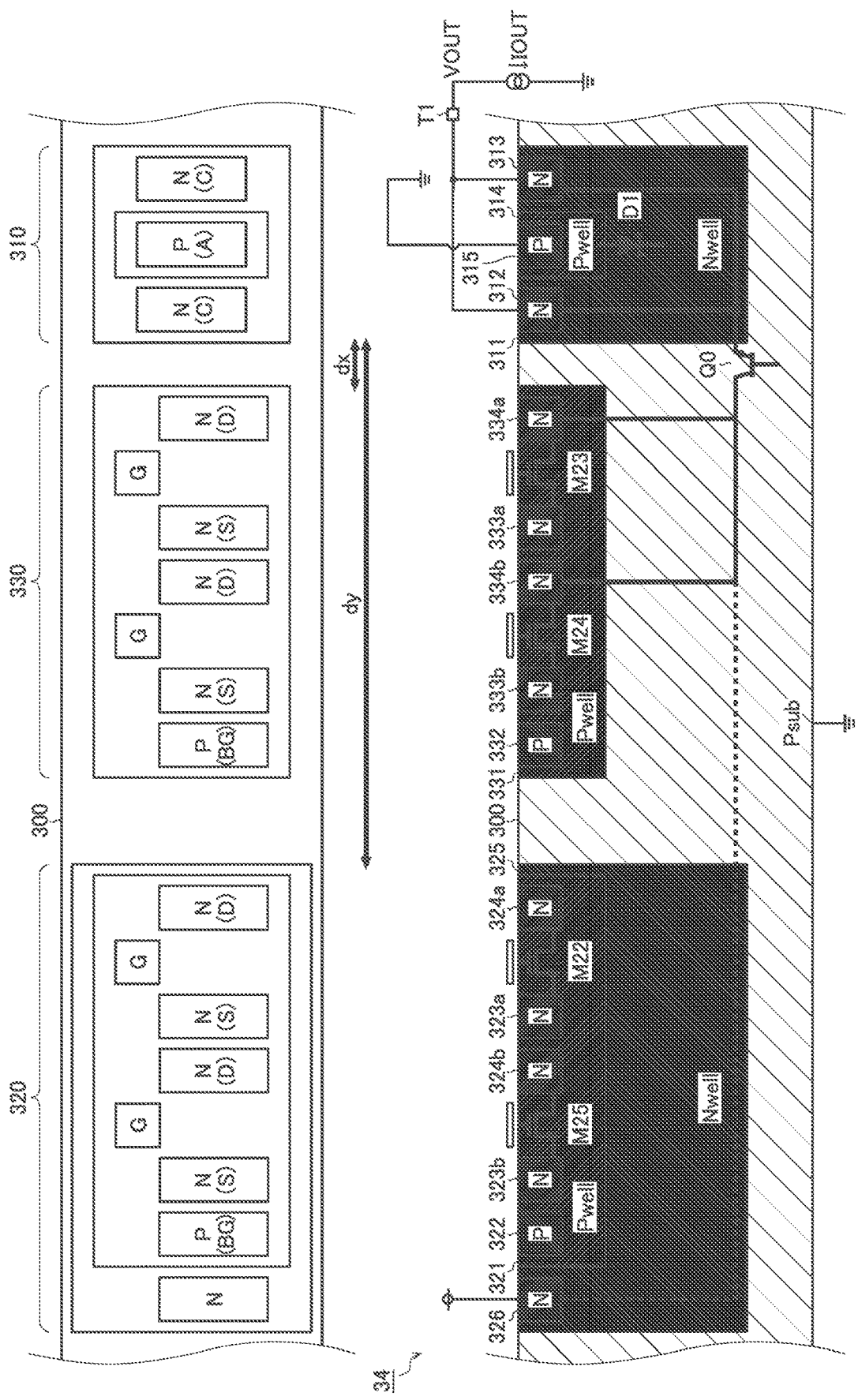
FIG. 21 is a diagram showing a plan-view layout and a vertical section in the tenth embodiment.

FIG. 21 is a diagram showing a plan-view layout (at top) and a vertical section (at bottom) of the semiconductor device 34. As shown there, the semiconductor device 34 is based on the eighth embodiment (FIG. 17), and has modifications applied to the element formation regions 320 and 330.

A first modification is that, in the P-type semiconductor well 321, N-type semiconductor regions 323a and 323b and N-type semiconductor regions 324a and 324b are formed. The N-type semiconductor regions 323a and 323b correspond to the source (S) and the drain (D) of the transistor M22, and on a channel region between them, a gate (G) is formed with an insulating layer interposed. The N-type semiconductor regions 324a and 324b correspond to the source (S) and the drain (D) of the transistor M25, and on a channel region between them, a gate (G) is formed with an insulating layer interposed. On the other hand, the P-type semiconductor well 321 and the P-type semiconductor contact 322 correspond to the respective backgates (BG) of the transistors M22 and M25.

A second modification is that, in the P-type semiconductor well 331, N-type semiconductor regions 333a and 333b and N-type semiconductor regions 334a and 334b are formed. The N-type semiconductor regions 333a and 333b correspond to the source (S) and the drain (D) of the transistor M23, and on a channel region between them, a gate (G) is formed with an insulating layer interposed. The N-type semiconductor regions 334a and 334b correspond to the source (S) and the drain (D) of the transistor M24, and on a channel region between them, a gate (G) is formed with an insulating layer interposed. On the other hand, the P-type semiconductor well 331 and the P-type semiconductor contact 332 correspond to the respective backgates (BG) of the transistors M23 and M24.

In the semiconductor device 34 having the device structure described above, a parasitic transistor Q0 is formed as, for example, an npn-type bipolar transistor resulting from the P-type semiconductor substrate 300 acting as a base, the N-type semiconductor well 311 and the N-type semiconductor contacts 312 and 313 (i.e., the cathode of the Zener diode D1) acting as an emitter, and the N-type semiconductor regions 334a and 334b closest to them (i.e., the respective drains of the transistors M23 and M24) acting as a collector.

With this device structure adopted, even if a negative voltage occurs at the external terminal T1 and the parasitic transistor Q0 operates, the operational amplifier AMP erroneously operates to turn off the transistor M1 (thereby achieving a fail-safe operation). This prevents the semiconductor device 31 and the set incorporating it from destruction.

Semiconductor Device, Eleventh Embodiment

Figure 22:
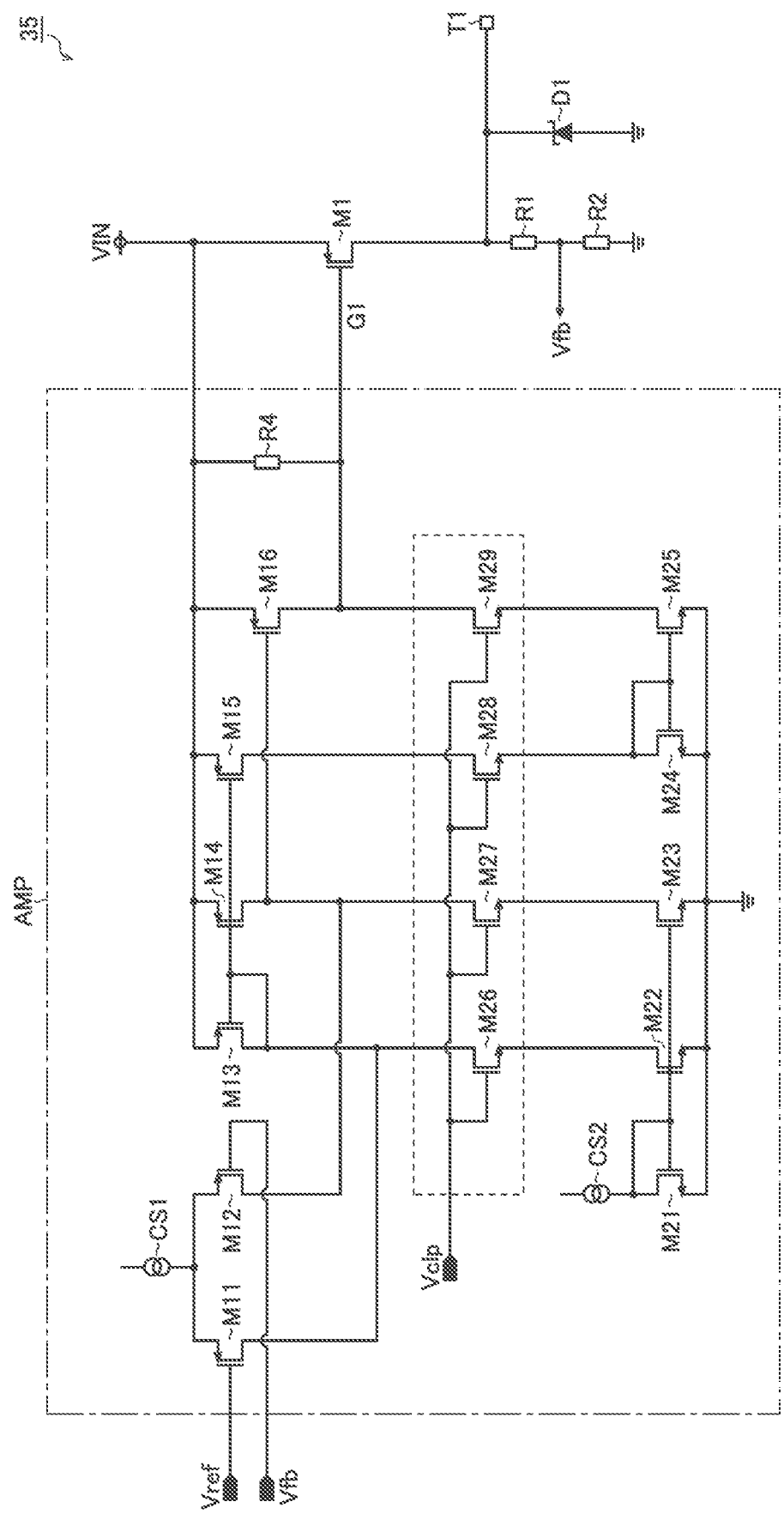
FIG. 22 is a diagram showing a semiconductor device according to eleventh embodiment.

FIG. 22 is a diagram showing a semiconductor device according to an eleventh embodiment. The semiconductor device 35 of this embodiment is based on the tenth embodiment (FIG. 20) described previously, and is modified to additionally include, as circuit elements of the operational amplifier AMP, N-channel MOS field-effect transistors M26 to M29 (corresponding to sixth to a ninth NMOSFET). The following description focuses on the modifications made.

The transistor M26 is inserted between the drain of the transistor M13 and the drain of the transistor M22. Specifically, The drain of the transistor M26 is connected to the drain of the transistor M13. The source of the transistor M26 is connected to the drain of the transistor M22. The gate of the transistor M26 is connected to an application terminal for a clamp voltage Vclp (<VIN) (corresponding to a fixed potential terminal).

The transistor M27 is inserted between the drain of the transistor M14 and the drain of the transistor M23. Specifically, the drain of the transistor M27 is connected to the drain of the transistor M14. The source of the transistor M27 is connected to the drain of the transistor M23. The gate of the transistor M27 is connected to the application terminal for the clamp voltage Vclp.

The transistor M28 is inserted between the drain of the transistor M15 and the drain of the transistor M24. Specifically, the drain of the transistor M28 is connected to the drain of the transistor M15. The source of the transistor M28 is connected to the drain of the transistor M24. The gate of the transistor M28 is connected to the application terminal for the clamp voltage Vclp.

The transistor M29 is inserted between the drain of the transistor M16 and the drain of the transistor M25. Specifically, the drain of the transistor M29 is connected to the drain of the transistor M16. The source of the transistor M29 is connected to the drain of the transistor M25. The gate of the transistor M29 is connected to the application terminal for the clamp voltage Vclp.

Providing these transistors M26 to M29 permits the respective drain-source voltages of the transistors M21 to M25 to be limited to the clamp voltage Vclp or lower. Thus, as the transistors M21 to M25, low-withstand-voltage elements (i.e., elements that withstand application of the clamp voltage Vclp) can be used, and this is advantageous in obtaining satisfactory current mirror element matching. As the transistors M26 to M29, high-withstand-voltage elements (i.e., elements that withstand application of the input voltage VIN) need to be used.

In the operational amplifier AMP configured as described above, classified into on-related elements Gon mentioned previously are, in addition to the transistors M25 and M22, the transistors M29 and M26. On the other hand, classified into off-related elements Goff mentioned previously are, in addition to the transistors M24 and M25, the transistors M27 and M28.

The transistors M21 to M23 form a current mirror, and so do the transistors M24 and M25; thus, within each group, element matching is important. On the other hand, among the transistors M26 to M29, element matching is not very important.

Accordingly, in the semiconductor device 35 of this embodiment, the transistors M27 and 28 are arranged closer to the Zener diode D1 than the transistors M26 and M29 are, and the transistors M21 to M25 are arranged farther away from the Zener diode D1 than the transistors M26 and M29 are. With this device structure adopted, it is possible to achieve a fail-safe operation as mentioned earlier while maintaining the characteristics of the operational amplifier AMP.

As described above, not all of a plurality of off-related elements Goff (e.g., transistors M23, M24, M27, and M28) necessarily need to be arranged close to the Zener diode D1; the arrangement layout can be optimized with consideration given to the required element matching and the adoptability of a floating structure.

Generic Definition

In the seventh to eleventh embodiments described above, the arrangement layout of elements is designed such that a parasitic element that turns off the output element on occurrence of a negative voltage operates first. However, an operation that contributes to the functional safety of a semiconductor device is not limited to turning off the output element. Needless to say, such operations include, for example, switching an error signal to a logic level associated with occurrence of a fault, and switching an enable signal to a logic level associated with a disabled state. That is, a parasitic element that operates first on occurrence of a negative voltage can be any element that initiates a fail-safe operation of a semiconductor device.

In view of what has just been discussed, a semiconductor device can be configured to include: an external terminal (e.g., the external terminal T1 mentioned previously); a parasitic factor element (e.g., the Zener diode D1 mentioned previously); a first element (e.g., an on-related element Gon mentioned previously) that is accompanied, between itself and the parasitic factor element, a parasitic element that operates so as to impair functional safety on occurrence of a negative voltage at the external terminal; and a second element (e.g., an off-related element Goff mentioned previously) that is accompanied, between itself and the parasitic factor element, a parasitic element that operates so as to contribute to functional safety on occurrence of a negative voltage at the external terminal. Here, the only requirement is that at least one of such second elements be formed closer to the parasitic factor element than the first element is, and what is performed as a fail-safe operation does not matter.

Overview

To follow is an overview of the various embodiments disclosed herein.

According to one aspect of what is disclosed herein, a semiconductor device includes: an external terminal; an output element; a detecting element configured to detect occurrence of a negative voltage at the external terminal; and an off-circuit configured to forcibly turn off the output element when the detecting element detects occurrence of the negative voltage. (A first configuration.)

In the semiconductor device of the first configuration described above, preferably, the detecting element is an N-channel transistor having a gate connected to a reference potential terminal and a source connected to the external terminal, or an npn-type transistor having a base connected to the reference potential terminal and an emitter connected to the external terminal. (A second configuration.)

In the semiconductor device of the first or second configuration described above, preferably, the off-circuit includes a switch element configured to short-circuit between the gate and the source of the output element when the detecting element detects occurrence of the negative voltage. (A third configuration.)

In the semiconductor device of the third configuration described above, preferably, the switch element is a P-channel transistor having a source connected to the source of the output element and a drain connected to the gate of the output element. (A fourth configuration.)

In the semiconductor device of the third or fourth configuration described above, preferably, the off-circuit further includes a resistor connected between the gate and the source of the switch element. (A fifth configuration.)

In the semiconductor device of any of the third to fifth configurations described above, preferably, the gate of the switch element is connected to the drain or the collector of the detecting element. (A sixth configuration.)

In the semiconductor device of any of the first to fifth configurations described above, preferably, there is further provided: a fault protection circuit configured to forcibly turn off the output element via the off-circuit not only when the fault protection circuit itself detects a fault in its own monitoring target but also when the detecting element detects occurrence of the negative voltage. (A seventh configuration.)

In the semiconductor device of the seventh configuration described above, preferably, the fault protection circuit is an overcurrent protection circuit, an overheat protection circuit, or an overvoltage protection circuit. (An eighth configuration.)

In the semiconductor device of any of the first to fifth configurations described above, preferably, there is further provided: an electrostatic protection element connected between the external terminal and the reference potential terminal. (A ninth configuration.)

In the semiconductor device of any of the first to ninth configurations described above, preferably, there is further provided: an output driver configured to drive the output element connected between an input terminal for an input voltage and the external terminal such that an output voltage appearing at the external terminal or a feedback voltage commensurate with the output voltage equals a predetermined reference voltage. (A tenth configuration.)

According to another aspect of what is disclosed herein, a semiconductor device includes: an external terminal; an output element; a first semiconductor region connected to the external terminal; a second semiconductor region forming an internal circuit; a third semiconductor region formed closer to the first semiconductor region than the second semiconductor region is; and an off-circuit configured to forcibly turn off the output element when a parasitic element formed between the first and third semiconductor regions turns on. (An eleventh configuration.)

In the semiconductor device of the eleventh configuration described above, preferably, the parasitic element is an npn-type transistor resulting from a P-type semiconductor substrate acting as a base, the first semiconductor region of an N type acting as an emitter, and the third semiconductor region of an N type acting as a collector. (A twelfth configuration.)

In the semiconductor device of the eleventh or twelfth configuration described above, preferably, the off-circuit includes a switch element configured to short-circuit between the gate and the source of the output element when the parasitic element turns on. (A thirteenth configuration.)

In the semiconductor device of the thirteenth configuration described above, preferably, the switch element is a P-channel transistor having a source connected to the source of the output element and a drain connected to the gate of the output element. (A fourteenth configuration.)

In the semiconductor device of the thirteenth or fourteenth configuration described above, preferably, the off-circuit further includes a resistor connected between the gate and the source of the switch element. (A fifteenth configuration.)

In the semiconductor device of any of the thirteenth to fifteenth configurations described above, preferably, the gate of the switch element is connected to the third semiconductor region. (A sixteenth configuration.)

In the semiconductor device of any of the eleventh to fifteenth configurations described above, preferably, there is further provided: a fault protection circuit configured to forcibly turn off the output element via the off-circuit not only when the fault protection circuit itself detects a fault in its own monitoring target but also when the parasitic element turns on. (A seventeenth configuration.)

In the semiconductor device of the seventeenth configuration described above, preferably, the fault protection circuit is an overcurrent protection circuit, an overheat protection circuit, or an overvoltage protection circuit. (An eighteenth configuration.)

In the semiconductor device of any of the eleventh to eighteenth configurations described above, preferably, the first semiconductor region forms an electrostatic protection element connected between the external terminal and the reference potential terminal. (A nineteenth configuration.)

In the semiconductor device of any of the eleventh to nineteenth configurations described above, preferably, there is further provided: an output driver configured to drive the output element connected between an input terminal for an input voltage and the external terminal such that an output voltage appearing at the external terminal or a feedback voltage commensurate with the output voltage equals a predetermined reference voltage. (A twentieth configuration.)

According to yet another aspect of what is disclosed herein, a semiconductor device includes: an external terminal; an output element; a parasitic factor element; a first element which, along with the parasitic factor element, forms a parasitic element that operates so as to turn on the output element when a negative voltage occurs at the external terminal; and a second element which, along with the parasitic factor element, forms a parasitic element that operates so as to turn off the output element when a negative voltage occurs at the external terminal. Preferably, the second element includes at least one second element formed closer to the parasitic factor element than the first element is. (A twenty-first configuration.)

In the semiconductor device of the twenty-first configuration described above, preferably, the first element is surrounded by an element separating region connected to a low-impedance node. (A twenty-second configuration.)

In the semiconductor device of the twenty-first or twenty-second configuration described above, preferably, there is further provided: a fault protection circuit configured to forcibly turn off the output element not only when the fault protection circuit itself detects a fault in its own monitoring target but also when the parasitic element formed by the second element operates. (A twenty-third configuration.)

In the semiconductor device of the twenty-third configuration described above, preferably, the fault protection circuit is an overcurrent protection circuit, an overheat protection circuit, or an overvoltage protection circuit. (A twenty-fourth configuration.)

In the semiconductor device of any of the twenty-first to twenty-fourth configurations described above, preferably, the first and second elements are part of the circuit elements constituting an output driver configured to drive the output element. (A twenty-fifth configuration.)

In the semiconductor device of the twenty-fifth configuration described above, preferably, the output driver includes: a first current source and a second current source; a first PMOSFET having a source connected to the first current source and a gate connected to a first input terminal; a second PMOSFET having a source connected to the first current source and a gate connected to a second input terminal; a third PMOSFET having a source connected to the first terminal of the output element and a gate and a drain connected to the drain of the first PMOSFET; a fourth PMOSFET having a source connected to the first terminal of the output element, a gate connected to the gate of the third PMOSFET, and a drain connected to the drain of the second PMOSFET; a fifth PMOSFET having a source connected to the first terminal of the output element and a gate connected to the gate of the third PMOSFET; a sixth PMOSFET having a source connected to the first terminal of the output element, a gate connected to the drain of the fourth PMOSFET, and a drain connected to the control terminal of the output element; a first NMOSFET having a drain and a gate connected to the second current source and a source connected to a reference potential terminal; a second NMOSFET having a drain connected to the drain of the first PMOSFET, a gate connected to the gate of the first NMOSFET, and a source connected to the reference potential terminal; a third NMOSFET having a drain connected to the drain of the second PMOSFET, a gate connected to the gate of the first NMOSFET, and a source connected to the reference potential terminal; a fourth NMOSFET having a drain and a gate connected to the drain of the fifth PMOSFET and a source connected to the reference potential terminal; and a fifth NMOSFET having a drain connected to the control terminal of the output element, a gate connected to the gate of the fourth NMOSFET, and a source connected to the reference potential terminal. Preferably, the third and fourth NMOSFETs are formed closer to the parasitic factor element than the second and fifth NMOSFETs are. (A twenty-sixth configuration.)

In the semiconductor device of the twenty-fifth configuration described above, preferably, the output driver includes: a first current source and a second current source; a first PMOSFET having a source connected to the first current source and a gate connected to a first input terminal; a second PMOSFET having a source connected to the first current source and a gate connected to a second input terminal; a third PMOSFET having a source connected to the first terminal of the output element and a gate and a drain connected to the drain of the first PMOSFET; a fourth PMOSFET having a source connected to the first terminal of the output element, a gate connected to the gate of the third PMOSFET, and a drain connected to the drain of the second PMOSFET; a fifth PMOSFET having a source connected to the first terminal of the output element and a gate connected to the gate of the third PMOSFET; a sixth PMOSFET having a source connected to the first terminal of the output element, a gate connected to the drain of the fourth PMOSFET, and a drain connected to the control terminal of the output element; a first NMOSFET having a drain and a gate connected to the second current source and a source connected to a reference potential terminal; a second NMOSFET and a third NMOSFET each having a gate connected to the gate of the first NMOSFET and a source connected to the reference potential terminal; a fourth NMOSFET having a drain and a gate connected together and a source connected to the reference potential terminal; a fifth NMOSFET having a gate connected to the gate of the fourth NMOSFET and a source connected to the reference potential terminal; a sixth NMOSFET having a drain connected to the drain of the first PMOSFET, a source connected to the drain of the second NMOSFET, and a gate connected to a fixed potential terminal; a seventh NMOSFET having a drain connected to the drain of the second PMOSFET, a source connected to the drain of the third NMOSFET, and a gate connected to the fixed potential terminal; an eighth NMOSFET having a drain connected to the drain of the fifth PMOSFET, a source connected to the drain of the fourth NMOSFET, and a gate connected to the fixed potential terminal; and a ninth NMOSFET having a drain connected to the control terminal of the output element, a source connected to the drain of the fifth NMOSFET, and a gate connected to the fixed potential terminal. Preferably, the seventh and eighth NMOSFETs are formed closer to the parasitic factor element than the sixth and ninth NMOSFETs are, and the first, second, third, fourth, and fifth NMOSFETs are formed farther away from the parasitic factor element than the sixth and ninth NMOSFETs are. (A twenty-seventh configuration.)

In the semiconductor device of any of the twenty-first to twenty-seventh configurations described above, preferably, the parasitic factor element is an electrostatic protection element connected to the external terminal. (A twenty-eighth configuration.)

In the semiconductor device of any of the twenty-first to twenty-eighth configurations described above, preferably, there is further provided: an output driver configured to drive the output element connected between an input terminal for an input voltage and the external terminal such that an output voltage appearing at the external terminal or a feedback voltage commensurate with the output voltage equals a predetermined reference voltage. (A twenty-ninth configuration.)

According to still another aspect of what is disclosed herein, a semiconductor device includes: an external terminal; a parasitic factor element, a first element which, along with the parasitic factor element, forms a parasitic element that operates so as to impair functional safety when a negative voltage occurs at the external terminal; and a second element which, along with the parasitic factor element, forms a parasitic element that operates so as to contribute to functional safety when a negative voltage occurs at the external terminal. Preferably, the second element includes at least one second element formed closer to the parasitic factor element than the first element is. (A thirtieth configuration.)

INDUSTRIAL APPLICABILITY

The invention disclosed herein finds wide applications in such semiconductor devices in general as have a parasitic element.

OTHER MODIFICATIONS

While the embodiments described above deal with examples of application to an LDO regulator IC, this is not meant to limit the target of application in any way. The various technical features disclosed herein can be implemented in any other manner than in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in a sense and scope equivalent to those of the claims.

What is claimed is:
1. A semiconductor device comprising:
   an external terminal;
   an output element;
   a detecting element configured to detect occurrence of a negative voltage at the external terminal, wherein the detecting element includes:
      an N-channel transistor having:
         a gate connected to a reference potential terminal, and
         a source connected to the external terminal; or
      an npn-type transistor having:
         a base connected to the reference potential terminal, and
         an emitter connected to the external terminal; and
   the semiconductor device further including an off-circuit configured to forcibly turn off the output element when the detecting element detects occurrence of the negative voltage, wherein the off-circuit includes a switch element configured to short-circuit between a gate and a source of the output element when the detecting element detects occurrence of the negative voltage.

2. The semiconductor device according to claim 1, wherein the switch element is a P-channel transistor having:
   a source connected to the source of the output element, and
   a drain connected to the gate of the output element.

3. The semiconductor device according to claim 1, wherein the off-circuit further includes a resistor connected between a gate and a source of the switch element.

4. The semiconductor device according to claim 1, wherein a gate of the switch element is connected to the drain or the collector of the detecting element.

5. The semiconductor device according to claim 1, further comprising:
   a fault protection circuit configured to forcibly turn off the output element via the off-circuit not only when the fault protection circuit itself detects a fault in its own monitoring target but also when the detecting element detects occurrence of the negative voltage.

6. The semiconductor device according to claim 5, wherein the fault protection circuit includes at least one of an overcurrent protection circuit, an overheat protection circuit, or an overvoltage protection circuit.

7. The semiconductor device according to claim 1, further comprising:
   an electrostatic protection element connected between the external terminal and the reference potential terminal.

8. The semiconductor device according to claim 1, further comprising:
   an output driver configured to drive the output element connected between an input terminal for an input voltage and the external terminal such that an output voltage appearing at the external terminal or a feedback voltage commensurate with the output voltage equals a predetermined reference voltage.

9. A semiconductor device comprising:
an external terminal;
an output element;
a first semiconductor region connected to the external terminal;
a second semiconductor region forming an internal circuit;
a third semiconductor region formed closer to the first semiconductor region than the second semiconductor region is; and
an off-circuit configured to forcibly turn off the output element when a parasitic element formed between the first and third semiconductor regions turns on,
wherein the parasitic element includes an npn-type transistor resulting from:
a P-type semiconductor substrate acting as a base,
the first semiconductor region of an N type acting as an emitter, and
the third semiconductor region of an N type acting as a collector;
wherein the base is connected to a reference potential terminal, and the emitter is connected to the external terminal; and
wherein the off-circuit includes a switch element configured to short-circuit between a gate and a source of the output element when the parasitic element turns on.

10. The semiconductor device according to claim 9, wherein the switch element includes a P-channel transistor having:
a source connected to the source of the output element, and
a drain connected to the gate of the output element.

11. The semiconductor device according to claim 9, wherein the off-circuit further includes a resistor connected between a gate and a source of the switch element.

12. The semiconductor device according to claim 9, wherein a gate of the switch element is connected to the third semiconductor region.

13. The semiconductor device according to claim 9, further comprising:
a fault protection circuit configured to forcibly turn off the output element via the off-circuit not only when the fault protection circuit itself detects a fault in its own monitoring target but also when the parasitic element turns on.

14. The semiconductor device according to claim 13, wherein the fault protection circuit includes at least one of an overcurrent protection circuit, an overheat protection circuit, or an overvoltage protection circuit.

15. The semiconductor device according to claim 9, wherein
the first semiconductor region forms an electrostatic protection element connected between the external terminal and the reference potential terminal.

16. The semiconductor device according to claim 9, further comprising:
an output driver configured to drive the output element connected between an input terminal for an input voltage and the external terminal such that an output voltage appearing at the external terminal or a feedback voltage commensurate with the output voltage equals a predetermined reference voltage.

17. A semiconductor device comprising:
an external terminal;
an output element;
a parasitic factor element;
a first element which, along with the parasitic factor element, forms a parasitic element that operates so as to turn on the output element when a negative voltage occurs at the external terminal; and
a second element which, along with the parasitic factor element, forms a parasitic element that operates so as to turn off the output element when a negative voltage occurs at the external terminal,
wherein the second element comprises at least one second element formed closer to the parasitic factor element than the first element is;
wherein the parasitic element includes an npn-type transistor having:
a base connected to a reference potential terminal, and
an emitter connected to the external terminal; and
wherein the off-circuit includes a switch element configured to short-circuit between a gate and a source of the output element when the parasitic element turns on.

18. The semiconductor device according to claim 17, wherein
the first element is surrounded by an element separating region connected to a low-impedance node.

19. The semiconductor device according to claim 18, further comprising:
a fault protection circuit configured to forcibly turn off the output element not only when the fault protection circuit itself detects a fault in its own monitoring target but also when the parasitic element formed by the second element operates.

20. The semiconductor device according to claim 19, wherein the fault protection circuit includes at least one of an overcurrent protection circuit, an overheat protection circuit, or an overvoltage protection circuit.

21. The semiconductor device according to claim 17, wherein
the first and second elements are part of circuit elements constituting an output driver configured to drive the output element.

22. The semiconductor device according to claim 21, wherein
the output driver includes:
a first current source and a second current source;
a first PMOSFET having
a source connected to the first current source and
a gate connected to a first input terminal;
a second PMOSFET having
a source connected to the first current source and
a gate connected to a second input terminal;
a third PMOSFET having
a source connected to a first terminal of the output element and
a gate and a drain connected to a drain of the first PMOSFET;
a fourth PMOSFET having
a source connected to the first terminal of the output element,
a gate connected to the gate of the third PMOSFET, and
a drain connected to a drain of the second PMOSFET;
a fifth PMOSFET having
a source connected to the first terminal of the output element and
a gate connected to the gate of the third PMOSFET;
a sixth PMOSFET having a source connected to the first terminal of the output element,
a gate connected to the drain of the fourth PMOSFET, and
a drain connected to a control terminal of the output element;
a first NMOSFET having
a drain and a gate connected to the second current source and
a source connected to a reference potential terminal;
a second NMOSFET having
a drain connected to the drain of the first PMOSFET,
a gate connected to a gate of the first NMOSFET, and
a source connected to the reference potential terminal;
a third NMOSFET having
a drain connected to the drain of the second PMOSFET,
a gate connected to the gate of the first NMOSFET, and
a source connected to the reference potential terminal;
a fourth NMOSFET having
a drain and a gate connected to a drain of the fifth PMOSFET and
a source connected to the reference potential terminal; and
a fifth NMOSFET having
a drain connected to the control terminal of the output element,
a gate connected to a gate of the fourth NMOSFET, and
a source connected to the reference potential terminal,
wherein
the third and fourth NMOSFETs are formed closer to the parasitic factor element than the second and fifth NMOSFETs are.

23. The semiconductor device according to claim 21, wherein
the output driver includes:
a first current source and a second current source;
a first PMOSFET having
a source connected to the first current source and
a gate connected to a first input terminal;
a second PMOSFET having
a source connected to the first current source and
a gate connected to a second input terminal;
a third PMOSFET having
a source connected to a first terminal of the output element and
a gate and a drain connected to a drain of the first PMOSFET;
a fourth PMOSFET having
a source connected to the first terminal of the output element,
a gate connected to the gate of the third PMOSFET, and
a drain connected to a drain of the second PMOSFET;
a fifth PMOSFET having
a source connected to the first terminal of the output element and
a gate connected to the gate of the third PMOSFET;
a sixth PMOSFET having
a source connected to the first terminal of the output element,
a gate connected to the drain of the fourth PMOSFET, and
a drain connected to a control terminal of the output element;
a first NMOSFET having
a drain and a gate connected to the second current source and
a source connected to a reference potential terminal;
a second NMOSFET and a third NMOSFET each having
a gate connected to a gate of the first NMOSFET and
a source connected to the reference potential terminal;
a fourth NMOSFET having
a drain and a gate connected together and
a source connected to the reference potential terminal;
a fifth NMOSFET having
a gate connected to the gate of the fourth NMOSFET and
a source connected to the reference potential terminal;
a sixth NMOSFET having
a drain connected to the drain of the first PMOSFET,
a source connected to a drain of the second NMOSFET, and
a gate connected to a fixed potential terminal;
a seventh NMOSFET having
a drain connected to the drain of the second PMOSFET,
a source connected to a drain of the third NMOSFET, and
a gate connected to the fixed potential terminal;
an eighth NMOSFET having
a drain connected to a drain of the fifth PMOSFET,
a source connected to the drain of the fourth NMOSFET, and
a gate connected to the fixed potential terminal; and
a ninth NMOSFET having
a drain connected to the control terminal of the output element,
a source connected to a drain of the fifth NMOSFET, and
a gate connected to the fixed potential terminal,
wherein
the seventh and eighth NMOSFETs are formed closer to the parasitic factor element than the sixth and ninth NMOSFETs are, and
the first, second, third, fourth, and fifth NMOSFETs are formed farther away from the parasitic factor element than the sixth and ninth NMOSFETs are.

24. The semiconductor device according to claim 17, wherein
the parasitic factor element is an electrostatic protection element connected to the external terminal.

25. The semiconductor device according to claim 17, further comprising:
an output driver configured to drive the output element connected between an input terminal for an input voltage and the external terminal such that an output voltage appearing at the external terminal or a feedback voltage commensurate with the output voltage equals a predetermined reference voltage.

26. A semiconductor device comprising:
an external terminal;
a parasitic factor element, a first element which, along with the parasitic factor element, forms a parasitic element that operates so as to impair functional safety when a negative voltage occurs at the external terminal; and
a second element which, along with the parasitic factor element, forms a parasitic element that operates so as to contribute to functional safety when a negative voltage occurs at the external terminal,
wherein the second element comprises at least one second element formed closer to the parasitic factor element than the first element is;
wherein the parasitic element includes an npn-type transistor having:
a base connected to a reference potential terminal, and
an emitter connected to the external terminal; and
wherein the off-circuit includes a switch element configured to short-circuit between a gate and a source of the output element when the parasitic element turns on.

* * * * *